(12) United States Patent
Bang et al.

(10) Patent No.: US 11,183,667 B2
(45) Date of Patent: Nov. 23, 2021

(54) DISPLAY DEVICE

(71) Applicant: Samsung Display Co., Ltd., Yongin-si (KR)

(72) Inventors: Ki Ho Bang, Hwaseong-si (KR); Eun Hye Kim, Namyangju-si (KR); Eun Ae Jung, Hwaseong-si (KR); Won Suk Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/933,818

(22) Filed: Jul. 20, 2020

(65) Prior Publication Data

US 2021/0119177 A1 Apr. 22, 2021

(30) Foreign Application Priority Data

Oct. 17, 2019 (KR) .................. 10-2019-0129020

(51) Int. Cl.
*H01L 51/52* (2006.01)
*H01L 27/32* (2006.01)
*G06F 3/041* (2006.01)
*G06F 3/044* (2006.01)

(52) U.S. Cl.
CPC ........ *H01L 51/5253* (2013.01); *G06F 3/0412* (2013.01); *H01L 27/323* (2013.01); *H01L 27/3276* (2013.01); *G06F 3/044* (2013.01); *G06F 3/04164* (2019.05); *G06F 2203/04102* (2013.01); *H01L 27/3246* (2013.01); *H01L 2251/5392* (2013.01)

(58) Field of Classification Search
CPC ............. H01L 51/5253; H01L 51/5237; H01L 51/5256; G06F 3/0412; G06F 3/044
See application file for complete search history.

(56) References Cited

U.S. PATENT DOCUMENTS

| 9,905,801 | B2 | 2/2018 | Kim |
| 10,340,317 | B2 | 7/2019 | Oh et al. |
| 10,381,420 | B2 * | 8/2019 | Liu ........................ G06F 3/0412 |

(Continued)

FOREIGN PATENT DOCUMENTS

| KR | 10-2016-0133614 | 11/2016 |
| KR | 10-1834792 | 3/2018 |
| KR | 10-2018-0131011 | 12/2018 |

*Primary Examiner* — Sardis F Azongha
(74) *Attorney, Agent, or Firm* — H.C. Park & Associates, PLC

(57) ABSTRACT

A display device includes a display area and a non-display area having a pad area. The display device includes: a substrate, a plurality of dams disposed on the substrate in the non-display area, an organic film disposed on the substrate in the display area and the non-display area and not overlapping at least some of the plurality of dams, an outer planarizing layer disposed outside the organic film and overlapping some of the plurality of dams, and a sensing line layer disposed on the organic film and the outer planarizing layer, wherein the plurality of dams include an inner dam, a middle dam, and an outermost dam, the non-display area includes a first non-display area disposed between the pad area and the display area, and the outer planarizing layer disposed in the first non-display area does not overlap the outermost dam disposed in the first non-display area.

20 Claims, 22 Drawing Sheets

(56) References Cited

U.S. PATENT DOCUMENTS

2015/0380685 A1* 12/2015 Lee .................... H01L 51/5237
 257/40
2018/0061899 A1* 3/2018 Oh ..................... H01L 51/5253
2018/0350884 A1 12/2018 Won et al.

* cited by examiner

DISPLAY DEVICE

CROSS REFERENE TO RELATED APPLICATION

This application claims priority from and the benefit of Korean Patent Application No. 10-2019-0129020, filed on Oct. 17, 2019, which is hereby incorporated by reference for all purposes as if fully set forth herein.

BACKGROUND

Field

Exemplary embodiments of the invention relate generally to a display device and, more specifically, to the display device in which an organic film of an encapsulation film in a non-display area is easily controlled and sensing characteristics are improved.

Discussion of the Background

The importance of display devices is increasing along with the development of multimedia. Accordingly, various kinds of display devices, such as liquid crystal displays (LCDs) and organic light-emitting diode (OLED) displays are being used. Among the display devices, the OLED display is a self-light-emitting device that is receiving attention as a next generation display device due to a wide viewing angle thereof.

However, since the OLED displays have characteristics of being degraded by external moisture, oxygen, or the like, light-emitting elements are sealed to protect the light-emitting elements from the external moisture, oxygen, or the like. Recently, in order to improve thinness and flexibility of the OLED displays, a plurality of organic films or a plurality of thin film encapsulation (TFE) layers including organic films and inorganic films are being used as components for sealing a light-emitting element.

The above information disclosed in this Background section is only for understanding of the background of the inventive concepts, and, therefore, it may contain information that does not constitute prior art.

SUMMARY

One or more exemplary embodiments of the present invention provides a display device in which an organic film of an encapsulation film in a non-display area is easily controlled and sensing characteristics are improved.

One or more exemplary embodiments of the present disclosure also provides a display device in which a short circuit between sensing lines as well as sensing electrodes of a sensing unit may be prevented or reduced.

Additional features of the inventive concepts will be set forth in the description with follows, and in part will be apparent from the description, or may be learned by practice of the inventive concepts According to one or more exemplary embodiments of the invention, a display device includes a display area and a non-display area which includes a pad area. The display device includes: a substrate, a plurality of dams disposed on the substrate in the non-display area, an organic film which is disposed on the substrate of the display area and the non-display area and does not overlap at least some of the plurality of dams, an outer planarizing layer which is disposed outside the organic film and overlaps some of the plurality of dams, and a sensing line layer disposed on the organic film and the outer planarizing layer, wherein the plurality of dams include an inner dam, a middle dam, and an outermost dam, the non-display area includes a first non-display area disposed between the pad area and the display area, and the outer planarizing layer disposed in the first non-display area does not overlap the outermost dam disposed in the first non-display area.

According to one or more exemplary embodiments, the sensing line layer may include a plurality of sensing lines.

According to one or more exemplary embodiments, the sensing lines may be spaced apart from each other on the organic film and the outer planarizing layer.

According to one or more exemplary embodiments, the outer planarizing layer may overlap the organic film.

According to one or more exemplary embodiments, the sensing lines may be spaced apart from each other on the outer planarizing layer.

According to one or more exemplary embodiments, a height of the outermost dam may be greater than a height of the inner dam and the middle dam.

According to one or more exemplary embodiments, a stepped portion may be formed due to the outermost dam.

According to one or more exemplary embodiments, the inner dam and the middle dam may have the same thickness.

According to one or more exemplary embodiments, the organic film may include a monomer composition or an organic material.

According to one or more exemplary embodiments, the non-display area further may include a second non-display area excluding the first non-display area and the pad area, and the outer planarizing layer may be disposed in the second non-display area may overlap the inner dam and the middle dam.

According to one or more exemplary embodiments, the outer planarizing layer may overlap at least a portion of the outermost dam.

According to one or more exemplary embodiments, the inner dam may be disposed in the first non-display area and the inner dam may be disposed in the second non-display area are integrally formed.

According to one or more exemplary embodiments of the invention, a display device, includes a display area and a non-display area disposed around the display area. The display area includes: a substrate, a planarizing film disposed on the substrate in the display area and the non-display area, a light-emitting layer disposed on the planarizing film of the display area, a pixel definition film disposed on the planarizing film in the non-display area and the light emitting layer in the display area, a first inorganic film disposed on the pixel definition film, an organic film disposed on the first inorganic film, a second inorganic film disposed on the organic film, a sensing line layer disposed on the second inorganic film, an outer planarizing layer interposed between the second inorganic film and the sensing line layer disposed in the non-display area, and a plurality of dams formed in the non-display area, wherein the plurality of dams include the pixel definition film and the planarizing film, the plurality of dams include an inner dam, a middle dam, and an outermost dam spaced apart from each other, and the outer planarizing layer is disposed to overlap the inner dam and at least a portion of the middle dam.

According to one or more exemplary embodiments, the non-display area may include a pad area and a first non-display area may be disposed between the pad area and the display area, and the outer planarizing layer may be disposed in the first non-display area does not overlap the outermost dam.

According to one or more exemplary embodiments, the outer planarizing layer may be disposed on the second inorganic film disposed on the organic film.

According to one or more exemplary embodiments, the sensing line layer may include a plurality of sensing lines, and at least one of the sensing lines may overlap the inner dam in a thickness direction thereof.

According to one or more exemplary embodiments, the first inorganic film and the second inorganic film may be in contact with each other on the inner dam.

According to one or more exemplary embodiments, the non-display area may include a second non-display area excluding the pad area and the first non-display area, and the outer planarizing layer may be disposed in the second non-display area is disposed above the inner dam and the middle dam.

According to one or more exemplary embodiments, the outer planarizing layer may be disposed in the second non-display area may overlap at least a portion of the outermost dam.

According to one or more exemplary embodiments, the sensing line layer may be disposed in the second non-display area includes a plurality of sensing lines, and some of the plurality of sensing lines may be disposed in the second non-display area are disposed to overlap at least one of the middle dam and the inner dam.

According to one or more exemplary embodiments of the invention, the display device having excellent reliability may be provided by forming a dam for controlling an organic film of an encapsulation film in a non-display area of the display device and providing an outer planarizing layer above the dam.

In addition, since an outer planarizing layer disposed in a non-display area adjacent to a pad region may be disposed to not overlap a dam disposed at an outermost side, a stepped portion caused by the dam disposed at the outermost side may be reduced to prevent or reduce defects such as disconnection and a short circuit.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the inventive concepts, and are incorporated in and constitute a part of this specification. The drawings illustrate exemplary embodiments of the inventive concepts and, together with the description, serve to explain principles of the inventive concepts.

DETAILED DESCRIPTION

Figure 1:
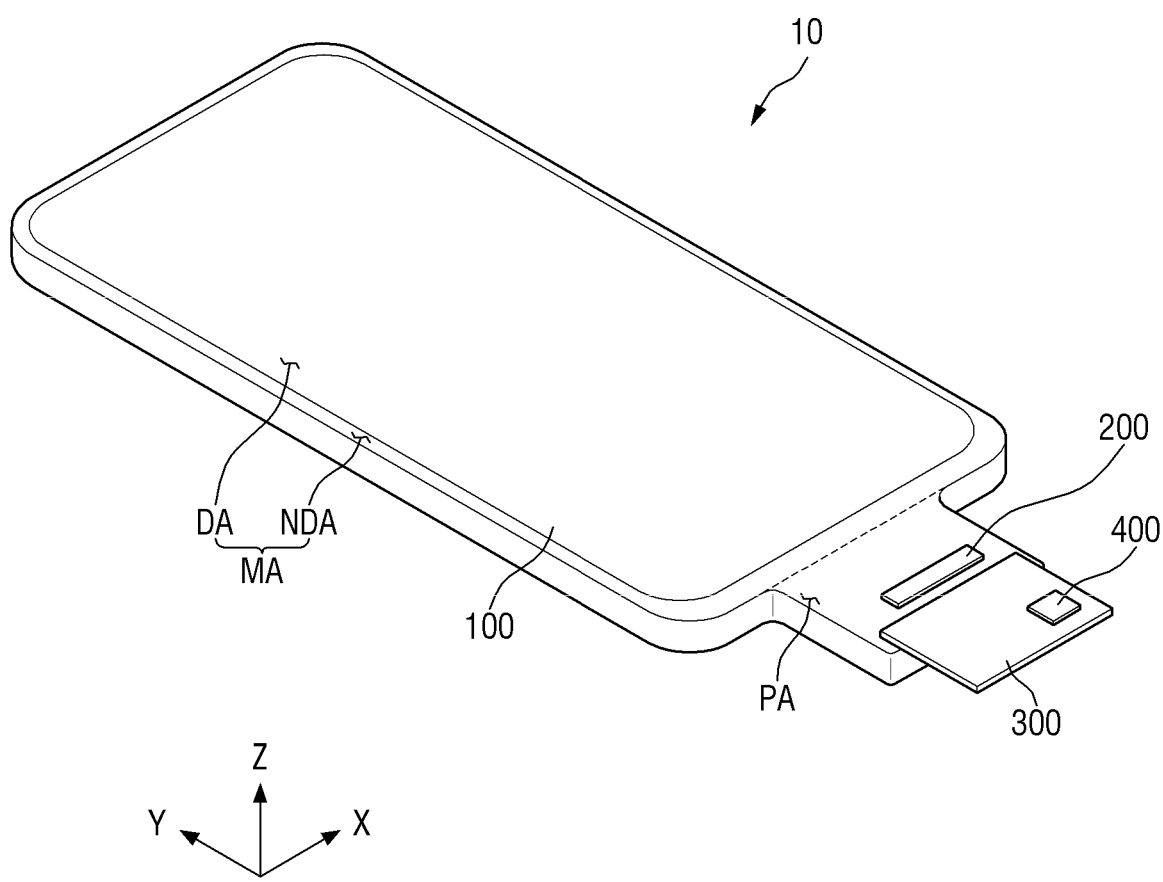
FIG. 1 is a perspective view illustrating a display device according to an embodiment of the inventive concepts.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In the accompanying figures, the size and relative sizes of layers, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, specific exemplary embodiments will be described with reference to the accompanying drawings.

Figure 2:
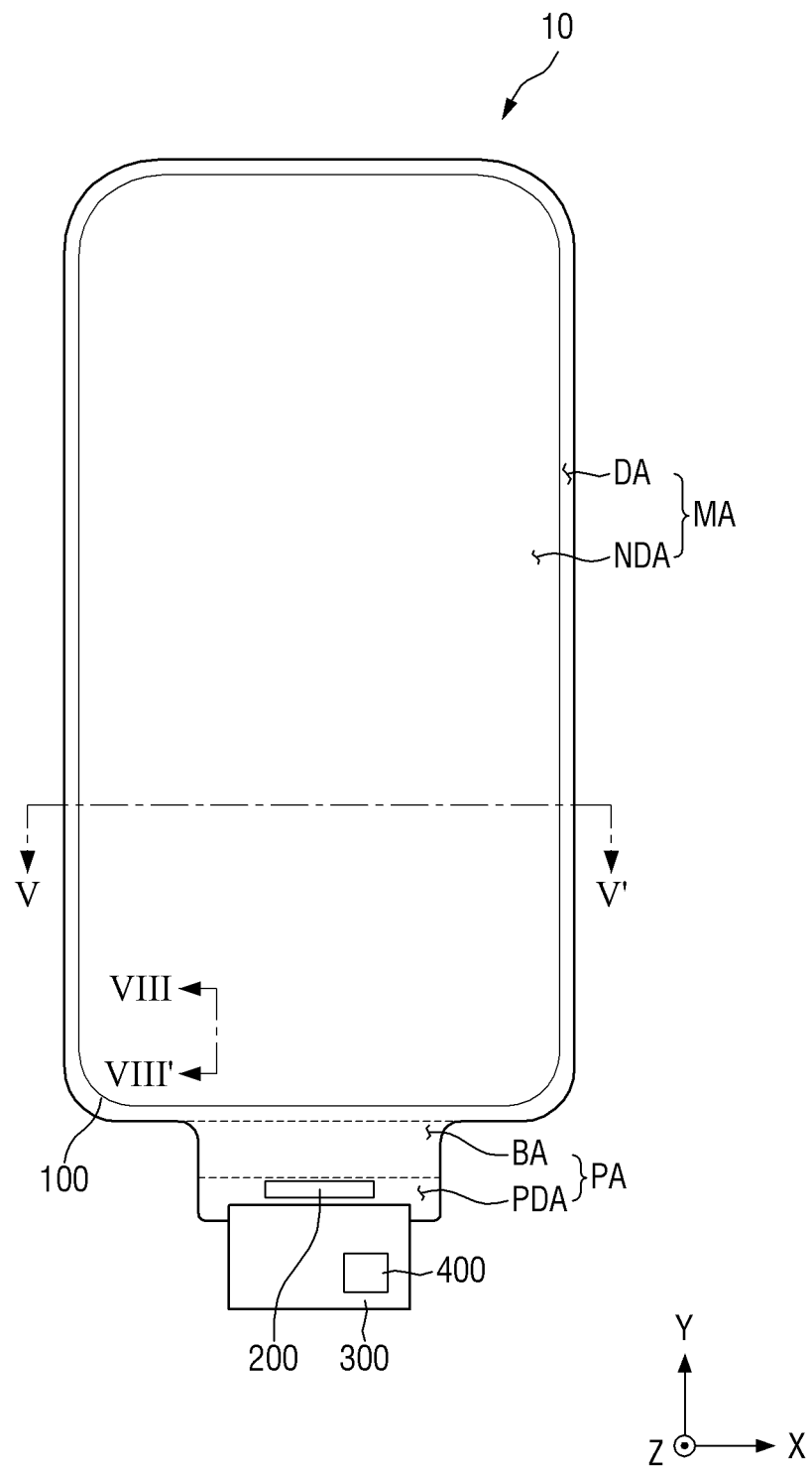
FIG. 2 is a plan view illustrating the display device according to an embodiment of the inventive concepts.
Figure 3:
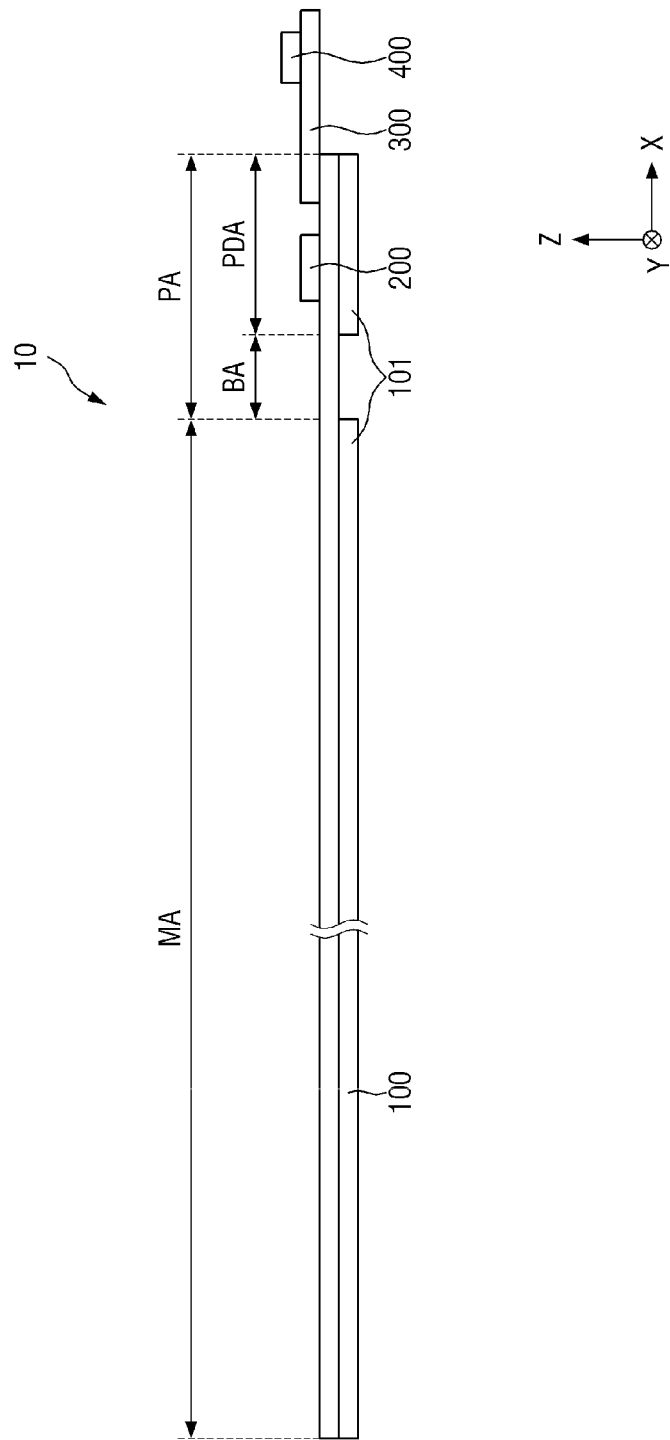
FIGS. 3 and 4 are side views illustrating the display device of FIG. 1.
Figure 4:
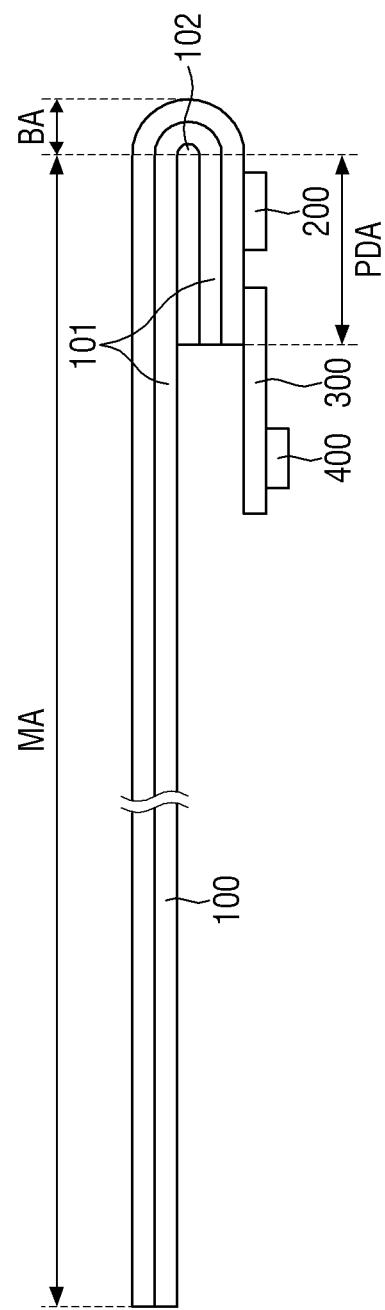

FIG. 1 is a perspective view illustrating a display device according to one exemplary embodiment. FIG. 2 is a plan view illustrating the display device of FIG. 1. FIGS. 3 and 4 are side views illustrating the display device of FIG. 1.

In the present specification, the terms "above," "upper portion," "top," and "upper surface" refer to an upward direction, that is, a Z-axis direction, based on a display panel 100, and the terms "below," "lower portion," "bottom," and "lower surface" refer to a downward direction, that is, a direction opposite to the Z-axis direction, based on the display panel 100. Further, the terms "left," "right," "upper," and "lower" refer to directions when the display panel 100 is viewed in a plan view. For example, the term "left" refers to a direction opposite to an X-axis direction, the term "right" refers to the X-axis direction, the term "upper" refers to a Y-axis direction, and the term "lower" refers to a direction opposite to the Y-axis direction.

Referring to FIGS. 1, 2, 3 and 4, a display device 10 is a device which displays a still image or a moving image. The display device 10 may be used in portable electronic devices such as a mobile phone, a smartphone, a tablet personal computer (PC), a smart watch, a watch phone, a mobile communication terminal, an electronic notebook, an electronic book, a portable multimedia player (PMP), a navigation device, an ultra mobile PC (UMPC) and may also be used as a display screen of various products such as a television, a laptop computer, a monitor, a billboard, and a device for Internet of Things (IoT). The display device 10 may be any one of an organic light-emitting display device, a liquid crystal display device, a plasma display device, a field emission display device, an electrophoretic display device, an electro-wetting display device, a quantum dot light-emitting display device, and a micro light-emitting diode (LED) display device. Hereinafter, it will be mainly described that the display device 10 is the organic light-emitting display device, but the present disclosure is not limited thereto.

The display device 10 according to one exemplary embodiment includes the display panel 100, a display driving circuit 200, a circuit board 300, and a touch driving circuit 400.

The display panel 100 may include a main area MA and a protrusion area PA protruding from one side of the main area MA.

The main area MA may be formed as a rectangular plane which has short sides in a first direction (X-axis direction) and long sides in a second direction (Y-axis direction)

intersecting the first direction (X-axis direction). A corner at which the short side in the first direction (X-axis direction) meets the long side in the second direction (Y-axis direction) may be rounded to have a certain curvature or formed at a right angle. A planar shape of the display device 10 is not limited to a square shape but may be formed in another polygonal shape, circular shape, or elliptical shape. The main area MA may be formed to be flat, but the present disclosure is not limited thereto. The main area MA may include curved portions formed at left and right end portions thereof. In this case, the curved portion may have a constant curvature or have a variable curvature.

The main area MA may include a display area DA in which pixels are formed to display an image and a non-display area NDA which is a peripheral area of the display area DA.

Not only the pixels but also scan lines, data lines, and power lines connected to the pixels may be disposed in the display area DA. When the main area MA includes the curved portion, the display area DA may be disposed on the curved portion. In this case, an image of the display panel 100 may also be displayed on the curved portion.

The non-display area NDA may be defined as an area from outside of the display area DA to an edge of the display panel 100. A scan driver configured to apply scan signals to the scan lines and link lines configured to connect the data lines and the display driving circuit 200 may be disposed in the non-display area NDA.

The protrusion area PA may protrude from one side of the main area MA. For example, as shown in FIG. 2, the protrusion area PA may protrude from a lower side of the main area MA. A length of the protrusion area PA in the first direction (X-axis direction) may be less than a length of the main area MA in the first direction (X-axis direction).

The protrusion area PA may include a bending area BA and a pad area PDA. In this case, the pad area PDA may be disposed at one side of the bending area BA, and the main area MA may be disposed at the other side of the bending area BA. For example, the pad area PDA may be disposed at a lower side of the bending area BA, and the main area MA may be disposed at an upper side of the bending area BA.

The display panel 100 may be formed to be flexible so as to be bendable, foldable, or rollable. Therefore, the display panel 100 may be bent in a thickness direction (Z-axis direction) from the bending area BA. As shown in FIG. 3, before the display panel 100 is bent, one surface of the pad area PDA of the display panel 100 faces upward. As shown in FIG. 4, after the display panel 100 is bent, one surface of the pad area PDA of the display panel 100 faces downward. Accordingly, the pad area PDA may be disposed on a lower portion of the main area MA and thus may overlap the main area MA.

Pads electrically connected to the display driving circuit 200 and the circuit board 300 may be disposed in the pad area PDA of the display panel 100.

A panel lower cover 101 may be disposed below the display panel 100. The panel lower cover 101 may be attached to a lower surface of the display panel 100 through an adhesive member. The adhesive member may be a pressure sensitive adhesive (PSA).

The panel lower cover 101 may include a light absorption member configured to absorb light incident from the outside, a buffer member configured to absorb an external impact, and a heat dissipation member configured to efficiently dissipate heat from the display panel 100.

The light absorption member may be disposed below the display panel 100. The light absorption member prevents transmission of light to prevent components disposed below the light absorption member, i.e., the circuit board 300 and the like, from being viewed from above the display panel 100. The light absorption member may include a light absorption material such as a black pigment or a black dye.

The buffer member may be disposed below the light absorption member. The buffer member absorbs an external impact to prevent or reduce the display panel 100 from being damaged. The buffer member may include a single layer or a plurality of layers. For example, the buffer member may be made of a polymer resin such as polyurethane, polycarbonate, polypropylene, or polyethylene or may be made of a material having elasticity, such as a sponge formed by foam-molding rubber, a urethane-based material, or an acrylic-based material. The buffer member may be a cushioning layer.

The heat dissipation member may be disposed below the buffer member. The heat dissipation member may include a first heat dissipation layer including graphite or carbon nanotubes and a second heat dissipation layer formed as a thin film made of a metal such as copper, nickel, ferrite, or silver, which is capable of shielding an electromagnetic wave and has high heat conductivity.

As shown in FIG. 3, in order for the display panel 100 to be easily bent, the panel lower cover 101 may not be disposed in the bending area BA of the display panel 100. Since the display panel 100 is bent in the bending area BA, the pad area PDA may be disposed below the main area MA to overlap the main area MA. Accordingly, the panel lower cover 101 disposed in the main area MA of the display panel 100 and the panel lower cover 101 disposed in the pad area PDA of the display panel 100 may be attached through an adhesive member 102. The adhesive member 102 may be a PSA.

The display driving circuit 200 outputs signals and voltages for driving the display panel 100. For example, the display driving circuit 200 may supply data voltages to the data lines. In addition, the display driving circuit 200 may supply a power voltage to a power line and may supply scan control signals to the scan driver. The display driving circuit 200 may be formed as an integrated circuit (IC) and may be mounted on the display panel 100 in the pad area PDA through a chip-on-glass (COG) method, a chip-on-plastic (COP) method, or an ultrasonic bonding method, but the present disclosure is not limited thereto. For example, the display driving circuit 200 may be mounted on the circuit board 300.

The pads may include display pads electrically connected to the display driving circuit 200 and sensing pads electrically connected to sensing lines.

The circuit board 300 may be attached onto the pads using an anisotropic conductive film. As a result, lead lines of the circuit board 300 may be electrically connected to the pads. The circuit board 300 may be a flexible film such as a flexible printed circuit board, a printed circuit board, or a chip-on film.

The touch driving circuit 400 may be connected to sensing electrodes of a sensing layer TSL of the display panel 100. The touch driving circuit 400 applies driving signals to the sensing electrodes of the sensing layer TSL and measures capacitance values of the sensing electrodes. The driving signal may be a signal having a plurality of driving pulses. The touch driving circuit 400 may determine, based on the capacitance values, whether a touch of a user is input and whether the user is in proximity to the display device 10. The touch of the user indicates that an object such as a user's finger or pen directly touches one surface of the display device 10 which is disposed on the sensing layer TSL. The proximity of the user indicates that an object such as the user's finger or pen hovers over the one surface of the display device 10.

The touch driving circuit 400 may be disposed on the circuit board 300. The touch driving circuit 400 may be formed as an IC and mounted on the circuit board 300.

Figure 5:
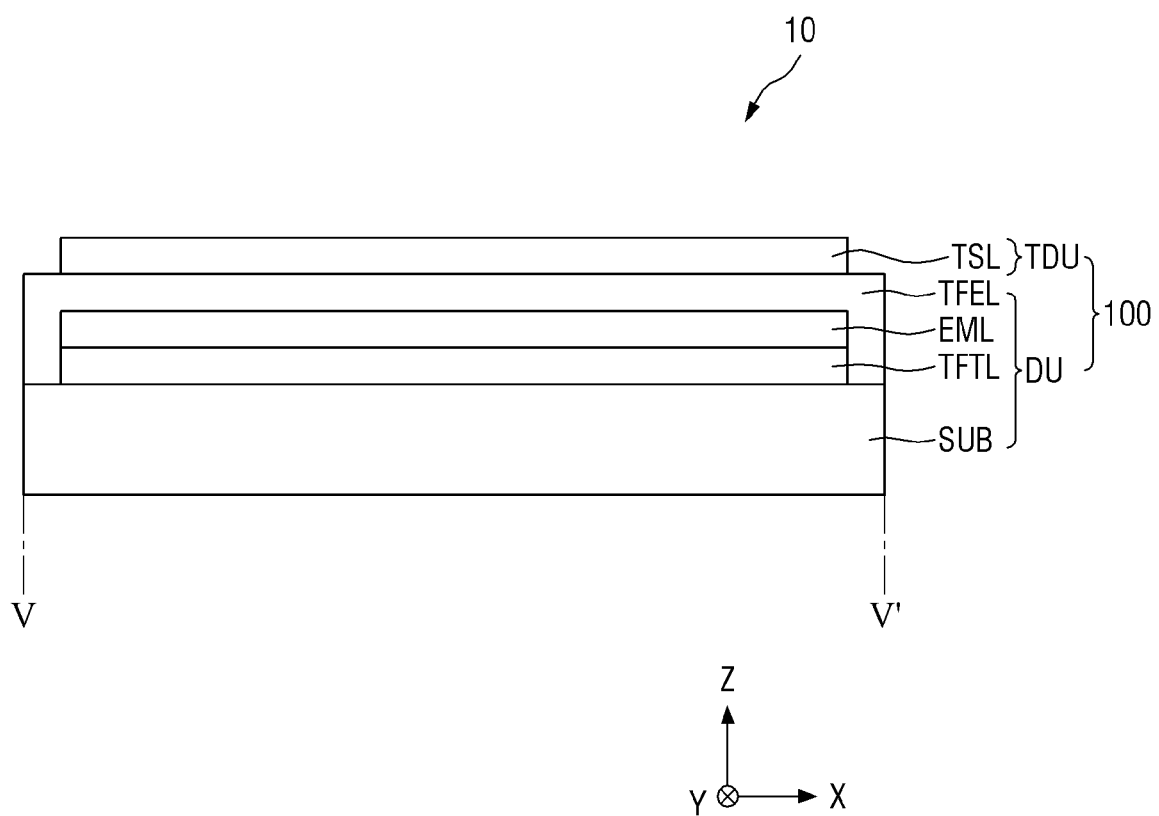
FIG. 5 is a cross-sectional view of an example which is taken along line V-V' of FIG. 2.

FIG. 5 is a cross-sectional view taken along line V-V' of FIG. 2.

Referring to FIG. 5, the display panel 100 may include a display unit DU which includes a substrate SUB, and a thin film transistor layer TFTL, a light-emitting element layer EML, and a thin film encapsulation layer TFEL which are disposed on the substrate SUB, and a sensing unit TDU which includes the sensing layer TSL.

The substrate SUB may be made of an insulating material such as glass, quartz, or a polymer resin. Examples of a polymeric material may be one selected from among polyethersulphone (PES), polyacrylate (PA), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (CAT), cellulose acetate propionate (CAP), and a combination thereof. Alternatively, the substrate SUB may include a metal material.

The substrate SUB may be a rigid substrate or a flexible substrate which is bendable, foldable, or rollable. When the substrate SUB is the flexible substrate, the substrate SUB may be made of PI, but the present disclosure is not limited thereto.

Figure 6:
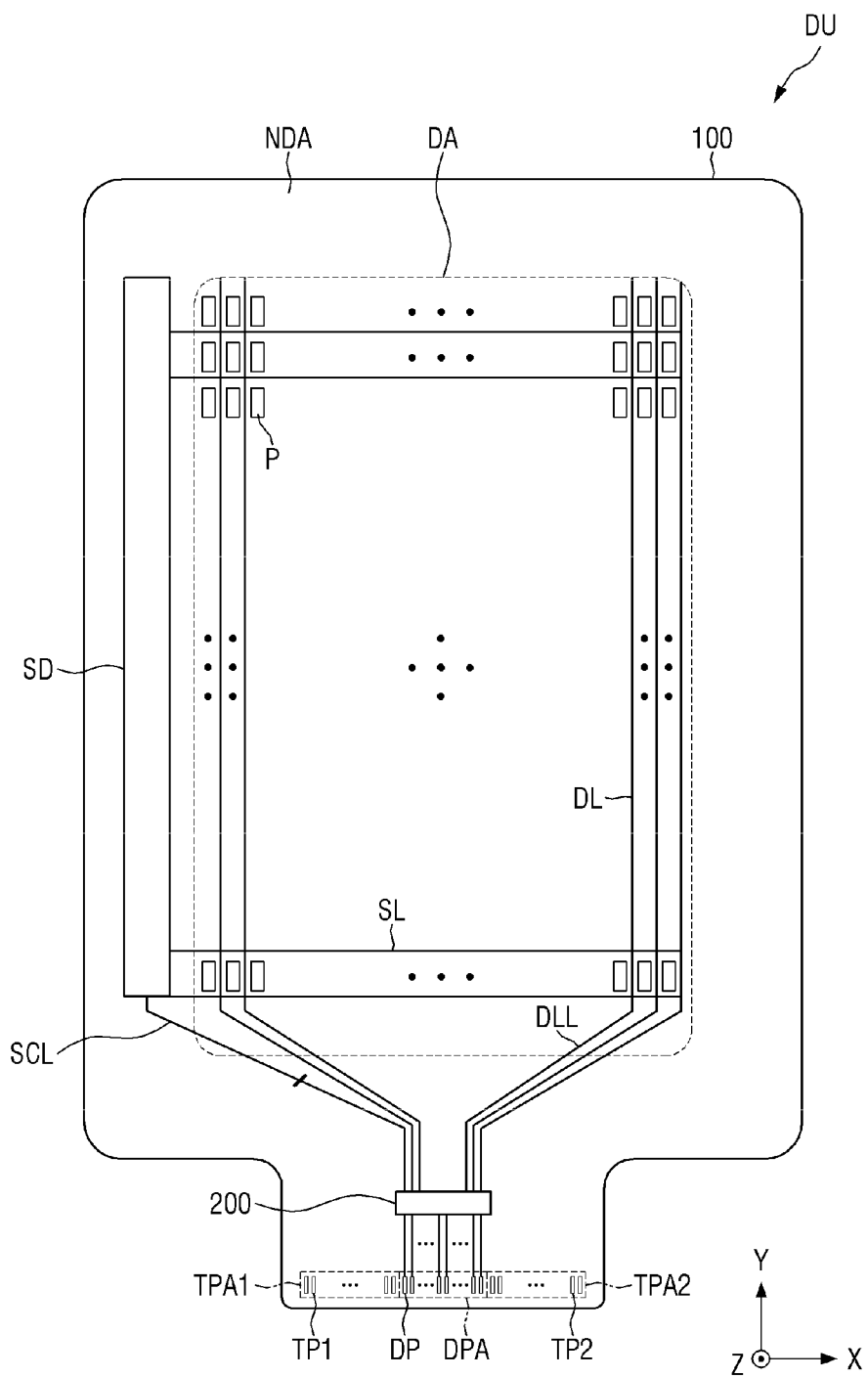
FIG. 6 is a plan view illustrating a display unit of FIG. 5 in detail according to an embodiment of the inventive concepts.

The thin film transistor layer TFTL may be disposed on the substrate SUB. Not only thin film transistors of each of the pixels but also scan lines, data lines, power lines, scan control lines, and routing lines connecting the pads and the data lines may be formed in the thin film transistor layer TFTL. Each of the thin film transistors may include a gate electrode, a semiconductor layer, a source electrode, and a drain electrode. When a scan driver SD is formed in the non-display area NDA of the display panel 100 as shown in FIG. 6, the scan driver SD may include thin film transistors.

The thin film transistor layer TFTL may be disposed in the display area DA and the non-display area NDA. Specifically, the thin film transistors of each of the pixels, the scan lines, the data lines, and the power lines of the thin film transistor layer TFTL may be disposed in the display area DA. The scan control lines and link lines of the thin film transistor layer TFTL may be disposed in the non-display area NDA. The thin film transistor layer TFTL will be described in detail below with reference to FIG. 8.

The light-emitting element layer EML may be disposed on the thin film transistor layer TFTL. The light-emitting element layer EML may include pixels which each include a first electrode, a light-emitting layer, and a second electrode, and a pixel definition film which defines the pixels. The light-emitting layer may be an organic light-emitting layer including an organic material. In this case, the light-emitting layer may include a hole transport layer, an organic light-emitting layer, and an electron transport layer. When a certain voltage is applied to the first electrode through the thin film transistor of the thin film transistor layer TFTL and a cathode voltage is applied to the second electrode, holes and electrons are moved to the organic light-emitting layer through the hole transport layer and the electron transport layer and are combined with each other in the organic light-emitting layer to emit light. The pixels of the light-emitting element layer EML may be disposed in the display area DA. The light-emitting element layer EML will be described in detail below with reference to FIG. 8.

The thin film encapsulation layer TFEL may be disposed on the light-emitting element layer EML. The thin film encapsulation layer TFEL serves to prevent or reduce oxygen or moisture from permeating into the light-emitting element layer EML. To this end, the thin film encapsulation layer TFEL may include at least one inorganic film. The inorganic film may be a silicon nitride layer, a silicon oxynitride layer, a silicon oxide layer, a titanium oxide layer, or an aluminum oxide layer but is not limited thereto. In addition, the thin film encapsulation layer TFEL serves to protect the light-emitting element layer EML from foreign substances such as dust. To this end, the thin film encapsulation layer TFEL may include at least one organic film. The organic film may be made of an acryl resin, an epoxy resin, a phenolic resin, a polyamide resin, a polyimide resin, or the like, but the present disclosure is not limited thereto.

The thin film encapsulation layer TFEL may be disposed in both of the display area DA and the non-display area NDA. Specifically, the thin film encapsulation layer TFEL may be disposed to cover the light-emitting element layer EML of the display area DA and the non-display area NDA and cover the thin film transistor layer TFTL of the non-display area NDA. The thin film encapsulation layer TFEL will be described in detail below with reference to FIG. 8.

The sensing layer TSL may be disposed on the thin film encapsulation layer TFEL. Since the sensing layer TSL is disposed directly on the thin film encapsulation layer TFEL, a thickness of the display device 10 may be decreased as compared with a case in which a separate touch panel including the sensing layer TSL is attached onto the thin film encapsulation layer TFEL.

Figure 7:
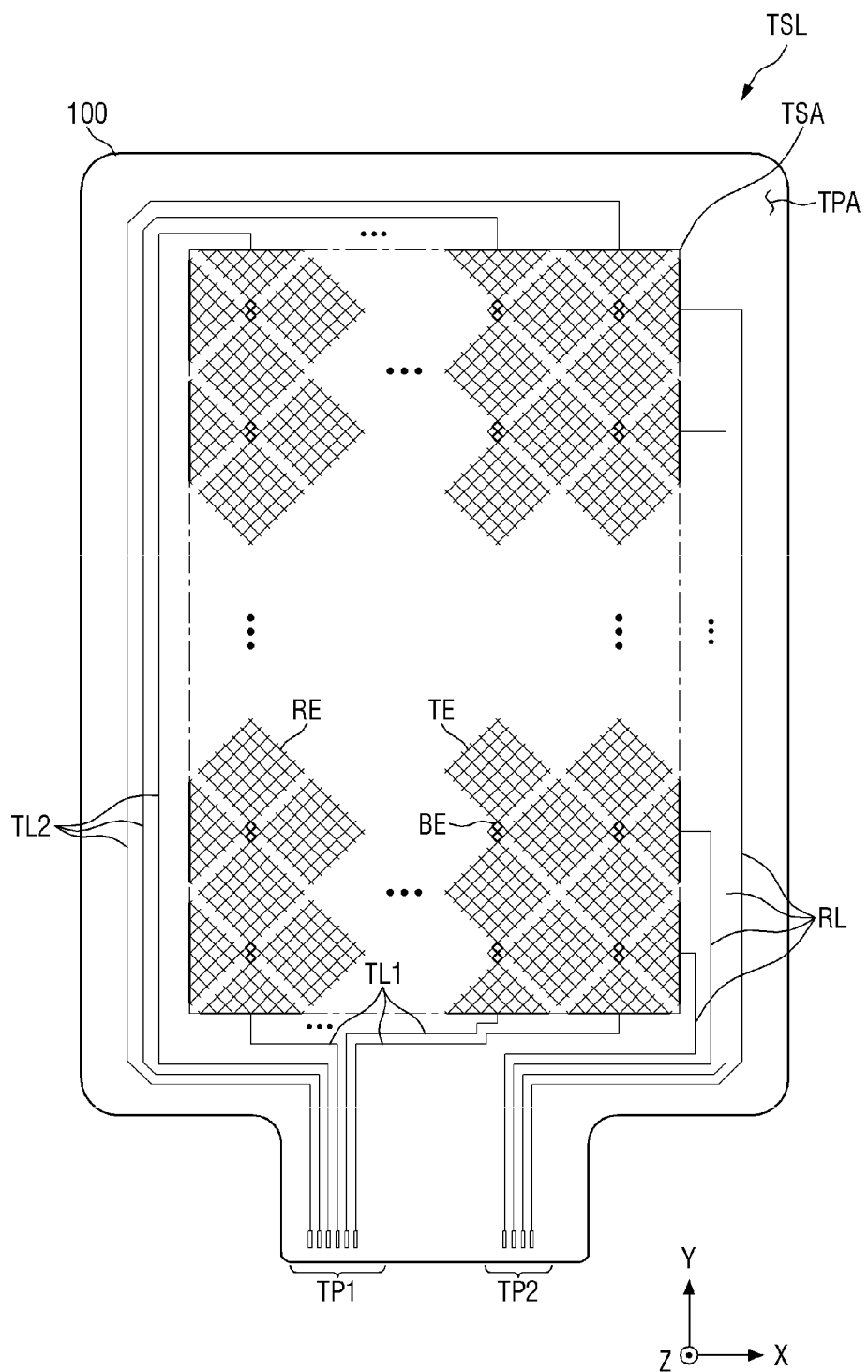
FIG. 7 is a plan view illustrating a sensing unit of FIG. 5 in detail according to an embodiment of the inventive concepts.

The sensing layer TSL may include a plurality of sensing electrodes for sensing a touch of a user using a mutual capacitance method and sensing lines connecting the pads and the sensing electrodes. As shown in FIG. 7, the sensing electrodes of the sensing layer TSL may be disposed in a sensing area TSA overlapping the display area DA. As shown in FIG. 7, the sensing lines of the sensing layer TSL may be disposed to partially overlap the sensing area TSA. Accordingly, the non-display area NDA of the display device 10 may be minimized.

A polarizing film may be disposed on the sensing layer TSL. The polarizing film PF may include a linear polarizer and a phase retardation film such as a quarter-wave plate. In this case, the phase retardation film may be disposed on the sensing layer TSL, and the linear polarizer may be disposed on the phase retardation film. In addition, a cover window may be disposed on the polarizing film. The cover window may be attached onto the polarizing film through a transparent adhesive member such as an optically clear adhesive (OCA) film.

FIG. 6 is a plan view illustrating components related to the display unit of FIG. 5.

For convenience of description, only pixels P, scan lines SL, data lines DL, scan control lines SCL, fan-out lines DLL, the scan driver SD, the display driving circuit 200, and display pads DP of the display unit DU are shown in FIG. 6.

Referring to FIG. 6, the scan lines SL, the data lines DL, and the pixels P are disposed in the display area DA. The scan lines SL may be formed parallel to each other in the first direction (X-axis direction), and the data lines DL may be formed parallel to each other in the second direction (Y-axis direction) intersecting the first direction (X-axis direction).

The fan-out lines DLL may include at least one line formed parallel to the data lines DL in the second direction (Y-axis direction) and a plurality of lines branched from the at least one line in the first direction (X-axis direction).

Each of the pixels P may be connected to at least one of the scan lines SL and one of the data lines DL. Each of the pixels P may include thin film transistors including a driving transistor and at least one switching transistor, an organic light-emitting element, and a capacitor. When a scan signal is applied from the scan line SL, each of the pixels P may receive a data voltage of the data line DL and may supply a driving current to the organic light-emitting element in response to the data voltage applied to a gate electrode thereof to emit light. It has been mainly described that a light-emitting element is an organic light-emitting element including an anode electrode, an organic light-emitting layer, and a cathode electrode, but the present disclosure is not limited thereto. The light-emitting element may be implemented as a quantum dot light-emitting element including an anode electrode, a quantum dot light-emitting layer, and a cathode electrode, an inorganic light-emitting element including an anode electrode, an inorganic light-emitting layer including an inorganic semiconductor, and a cathode electrode, or a micro light-emitting element including a micro light-emitting diode.

The scan driver SD is connected to the display driving circuit 200 through a plurality of scan control lines SCL. Therefore, the scan driver SD may receive the scan control signals of the display driving circuit 200. The scan driver SD generates scan signals in response to the scan control signals and supplies the scan signals to the scan lines SL.

In FIG. 6, the scan driver SD is illustrated as being formed in the non-display area NDA outside a left side of the display area DA, but the present disclosure is not limited thereto. For example, the scan driver SD may be formed in the non-display area NDA outside left and right sides of the display area DA.

The display driving circuit 200 is connected to the display pads DP and receives digital video data and timing signals. The display driving circuit 200 converts the digital video data into analog positive/negative data voltages and supplies the analog positive/negative data voltages to the data lines DL through the fan-out lines DLL. Furthermore, the display driving circuit 200 generates and supplies scan control signals for controlling the scan driver 110 through the plurality of scan control lines SCL. The pixels P to which the data voltages are supplied are selected by the scan signals of the scan driver SD, and the data voltages are supplied to the selected pixels P. The display driving circuit 200 may be formed as an IC and may be attached onto the substrate SUB through a COG method, a COP method, or an ultrasonic bonding method, but the present disclosure is not limited thereto. For example, the display driving circuit 200 may be mounted on the circuit board 300.

As shown in FIG. 6, the display panel 100 may include the display pads DP electrically connected to the display driving circuit 200 and sensing pads TP1 and TP2 electrically connected to the sensing lines. A display pad area DPA in which the display pads DP are disposed may be disposed between a first sensing pad area TPA1 in which first sensing pads TP1 are disposed and a second sensing pad area TPA2 in which second sensing pads TP2 are disposed. As shown in FIG. 6, the display pad area DPA may be disposed at a center of one end of the protrusion area PA, the first sensing pad area TPA1 may be disposed at a left side of the one end of the protrusion area PA, and the second sensing pad area TPA2 may be disposed at a right side of the one end of the protrusion area PA.

The circuit board 300 may be attached onto the display pads DP and the sensing pads TP1 and TP2 using an anisotropic conductive film. Thus, the lead lines of the circuit board 300 may be electrically connected to the display pads DP and the sensing pads TP1 and TP2. The circuit board 300 may be a flexible film such as a flexible printed circuit board, a printed circuit board, or a chip-on film.

The touch driving circuit 400 may be connected to the sensing electrodes of the sensing unit of the display panel 100. The touch driving circuit 400 applies driving signals to the sensing electrodes and measures mutual electrostatic capacitances (hereinafter, referred to as "mutual capacitances") of the sensing electrodes. The driving signal may be a signal having a plurality of driving pulses. The touch driving circuit 400 may calculate touch coordinates at which a touch is input based on mutual capacitances.

FIG. 7 is a plan view illustrating the sensing unit of FIG. 5 in detail according to one exemplary embodiment.

For convenience of description, only sensing electrodes TE and RE, sensing lines TL and RL, and sensing pads TP are shown in FIG. 7.

Referring to FIG. 7, the sensing unit TDU includes the sensing area TSA for sensing a touch of a user and a sensing peripheral area TPA disposed at a periphery of the sensing area TSA. The sensing area TSA may overlap the display area DA of the display unit DU, and the sensing peripheral area TPA may overlap the non-display area NDA of the display unit DU.

The sensing electrodes TE and RE may be disposed in the sensing area TSA. The sensing electrodes RE and TE may include first sensing electrodes TE and second sensing electrodes RE. In the exemplary embodiment shown in FIG. 7, it will be mainly described that the first sensing electrode TE is a driving electrode and the second sensing electrode RE is a sensing electrode.

A plurality of first sensing electrodes TE may be disposed in a plurality of columns in the second direction (Y-axis direction), and the second sensing electrodes RE may be disposed in a plurality of rows in the first direction (X-axis direction). The first sensing electrodes TE disposed in each of the plurality of columns in the second direction Y may be electrically connected. In addition, the second sensing electrodes RE disposed in each of the plurality of rows in the first direction X may be electrically connected.

The first sensing electrodes TE and the second sensing electrodes RE may be formed in a diamond or triangular shape in a plan view. Specifically, the first sensing electrodes TE and the second sensing electrodes RE disposed at edges of the sensing area TSA may be formed in a triangular shape in a plan view, and other first sensing electrodes TE and second sensing electrodes RE may be formed in a diamond shape in a plan view. In FIG. 7, each of the first sensing electrodes TE and the second sensing electrodes RE is illustrated as having a rhombus or triangular planar shape, but the planar shape of each of the first sensing electrodes TE and the second sensing electrodes RE is not limited thereto.

The first sensing electrodes TE and the second sensing electrodes RE may be formed as mesh-shaped electrodes. When the sensing layer TSL including the first sensing electrodes TE and the second sensing electrodes RE is formed directly on the thin film encapsulation layer TFEL, a distance between a second electrode of the light-emitting element layer EML and the first sensing electrodes TE or the second sensing electrodes RE of the sensing layer TSL may be small. Accordingly, very high parasitic capacitance may be formed between the second electrode of the light-emitting element layer EML and the first sensing electrodes TE or the second sensing electrodes RE of the sensing layer TSL. Therefore, in order to reduce the parasitic capacitance, the first sensing electrodes TE and the second sensing electrodes RE may be formed as mesh-shaped electrodes rather than unpatterned electrodes of a conductive layer made of a transparent oxide such as indium tin oxide (ITO) or indium zinc oxide (IZO).

The first sensing electrodes TE and the second sensing electrodes RE may be electrically separate from each other. The first sensing electrodes TE and the second sensing electrodes RE may be disposed to be spaced apart from each other.

In order to prevent or reduce the first sensing electrodes TE and the second sensing electrodes RE from being short-circuited to each other in intersection regions thereof, the first sensing electrodes TE adjacent to each other in the second direction (Y-axis direction) may be electrically connected through connection electrodes BE. In this case, the first sensing electrodes TE and the second sensing electrodes RE may be disposed in one layer, and the connection electrodes BE may be disposed on a layer different from the first sensing electrodes TE and the second sensing electrodes RE. In addition, the second sensing electrodes RE electrically connected in the second direction (Y-axis direction) and the first sensing electrodes TE electrically connected in the second direction (Y-axis direction) are electrically insulated from each other.

The sensing pads TP1 and TP2, sensing lines TL1, TL2, and RL, guard lines, and ground lines may be disposed in the sensing peripheral area TPA.

The sensing pads TP1 and TP2 may be disposed at one side of the display device 10. The circuit board 300 may be attached onto the sensing pads TP1 and TP2 using an anisotropic conductive film. As a result, the sensing pads TP1 and TP2 may be electrically connected to the circuit board 300. The sensing pads TP1 and TP2 may include the first sensing pads TP1 and the second sensing pads TP2.

The sensing lines TL1, TL2, and RL may include first sensing lines TL1, second sensing lines TL2, and third sensing lines RL.

One end portions of the first sensing lines TL1 may be connected to one sides of the first sensing electrodes TE. That is, one end portions of the first sensing lines TL1 may be connected to the first sensing electrodes TE disposed at a lower side of the sensing area TSA. Among four sides of the sensing area TSA, the lower side of the sensing area TSA may be a side closest to sensing pad areas in which the sensing pads TP1 and TP2 are disposed. The other end portions of the first sensing lines TL1 may be connected to some of the first sensing pads TP1 of the pad area. That is, the first sensing line TL1 may serve to connect one side of the first sensing electrode TE and the first sensing pad TP1.

One end portions of the second sensing lines TL2 may be connected to the other sides of the first sensing electrodes TE. That is, one end portions of the second sensing lines TL2 may be connected to the first sensing electrodes TE disposed at an upper side of the sensing area TSA. The upper side of the sensing area TSA may be a side opposite to the lower side of the sensing area TSA. Among the four sides of the sensing area TSA, the upper side of the touch sensing area TSA may be a side positioned farthest from the sensing pad areas in which the sensing pads TP1 and TP2 are disposed. The second sensing lines TL2 may be connected to the first sensing electrodes TE, which are disposed at the upper side of the sensing area TSA, via the lower side and a left side of the sensing area TSA. The other end portions of the second sensing lines TL2 may be connected to others of the first sensing pads TP1 in the sensing pad area. That is, the second sensing line TL2 may serve to connect the other side of the first sensing electrode TE and the first sensing electrode pad TP1.

One end portions of the third sensing lines RL may be connected to one sides of the second sensing electrodes RE. That is, one end portions of the third sensing lines RL may be connected to the second sensing electrodes RE disposed at a right side of the sensing area TSA. The right side of the sensing area TSA may be a side opposite to the left side and may be a side disposed between the upper side and the lower side in the second direction DR2. The other end portions of the third sensing lines RL may be connected to the second sensing pads TP2 in the sensing pad region. That is, the third sensing line RL may serve to connect the second sensing electrode RE and the second sensing pad TP2.

The first sensing electrode TE and the second sensing electrodes RE may be driven through a mutual capacitance method or a self-capacitance method.

First, when the first sensing electrodes TE and the second sensing electrodes RE are driven through the mutual capacitance method, touch driving signals may be supplied to the first sensing electrodes TE through the first sensing lines TL1 and the second sensing lines TL2 to charge mutual capacitances formed in the intersection regions between the first sensing electrodes TE and the second sensing electrodes RE. Then, charge change amounts of the mutual capacitances are measured through the second sensing electrodes RE, and whether a touch is input is determined according to the charge change amounts of the mutual capacitances. The touch driving signal may be a signal having a plurality of touch driving pulses.

Second, when the first sensing electrodes TE and the second sensing electrode RE are driven through the self-capacitance method, touch driving signals are supplied to all of the first sensing electrodes TE and the second sensing electrodes RE through the first sensing lines TL1, the second sensing lines TL2, and the third sensing lines RL to charge self-capacitances of the first sensing electrodes TE and the second sensing electrodes RE. Then, charge change amounts of the self-capacitances are measured through the first sensing lines TL1, the second sensing lines TL2, and the third sensing lines RL, and whether a touch is input is determined according to the charge change amounts of the self-capacitances.

Hereinafter, for convenience of description, it will be mainly described that the first sensing electrodes TE and the second sensing electrodes RE are driven through the mutual capacitance method in which a plurality of touch driving pulses are applied to the first sensing electrodes TE and charge change amounts of mutual capacitances are measured through the third sensing lines RL connected to the second sensing electrodes RE. In this case, the first sensing electrodes TE may serve as driving electrodes, the second sensing electrodes RE may serve as sensing electrodes, the first sensing lines TL1 and the second sensing lines TL2 may server as driving lines, and the third sensing lines RL may serve as sensing lines.

Although not shown, sensing lines and guard lines may be further disposed outside the sensing lines TL1, TL2, and RL. The guard lines may be disposed outside the sensing lines TL1, TL2, and RL disposed at an outermost side among the sensing lines TL1, TL2, and RL, and the ground lines may be disposed outside the guard lines. A ground voltage may be applied to the ground lines. Thus, when static electricity is externally applied, the static electricity may be discharged to the ground lines. The guard lines may be disposed between the sensing lines TL1, TL2, and RL disposed at the outermost side and the ground lines. Since the guard lines are disposed between the sensing lines TL1, TL2, and RL disposed at the outermost side and the ground lines, the guard lines may serve to minimize the sensing lines TL1, TL2, and RL being influenced by a change in voltage of the ground lines.

When the sensing electrodes TE and RE are driven in the mutual capacitance method, a ground voltage may be applied to the ground lines. In addition, when the sensing electrodes TE and RE are driven in the self-capacitance method, the same driving signals as driving signals applied to the sensing lines TL1, TL2, and RL may be applied to the guard lines.

Figure 8:
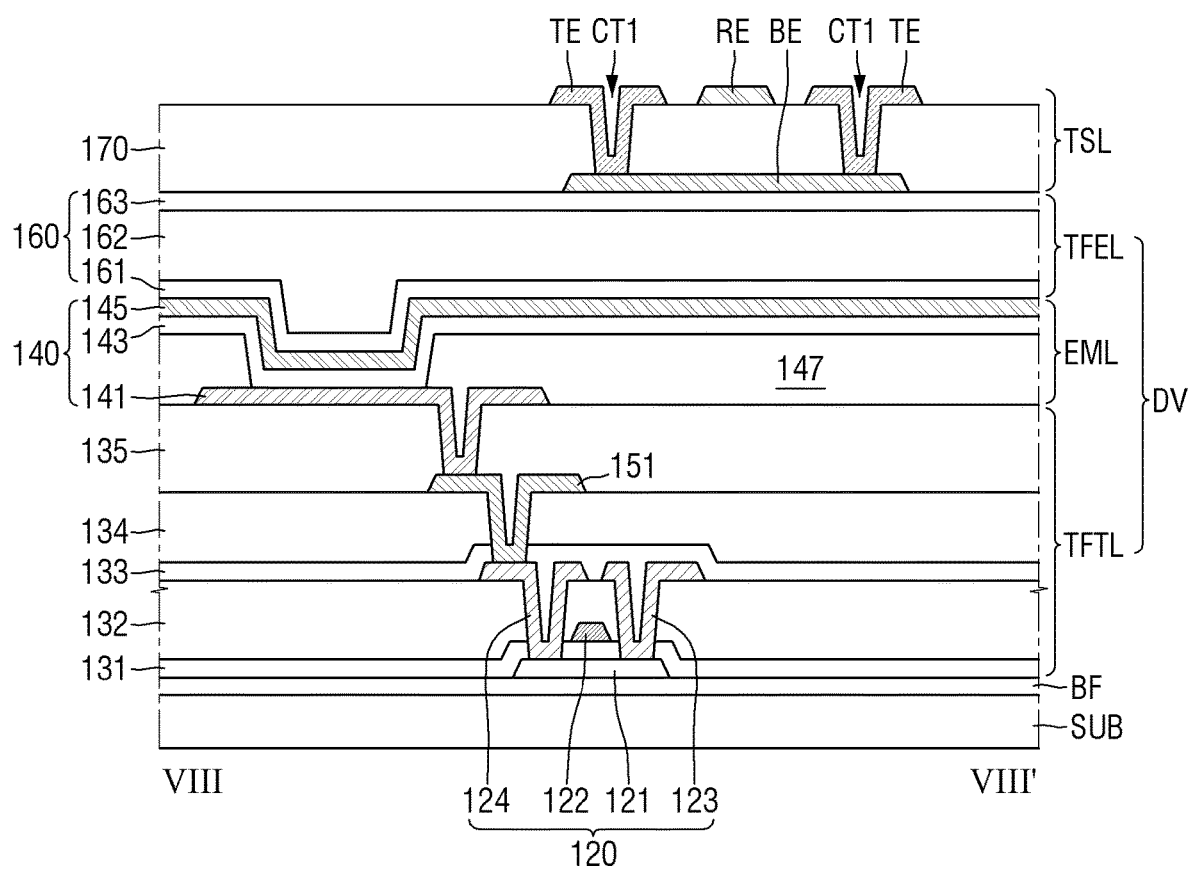
FIG. 8 is a cross-sectional view of an example which is taken along line VIII-VIII' of FIG. 2.

FIG. 8 is a cross-sectional view of an example which is taken along line VIII-VIII' of FIG. 2. FIG. 8 illustrates a cross-sectional structure of the display area DA of the display device 10. A cross-sectional structure of the non-display area NDA of the display device 10 will be described below with reference to FIG. 11.

Referring to FIG. 8, the thin film transistor layer TFTL is formed on the substrate SUB. The thin film transistor layer TFTL includes thin film transistors 120, a connection electrode 151, a gate insulating film 131, a first interlayer insulating film 132, a protective film 133, a second interlayer insulating film 134, and a planarizing film 135.

A buffer film BF may be formed on one surface of the substrate SUB. The buffer film BF may be formed on one surface of the substrate SUB to protect the thin film transistors 120 and an organic light-emitting layer 143 of the light-emitting element layer EML from moisture permeating through the substrate SUB which is vulnerable to moisture transmission. The buffer film BF may include a plurality of inorganic films which are alternately stacked. For example, the buffer film BF may be formed as a multi-layer film in which one or more inorganic films among a silicon oxide ($SiO_x$) layer, a silicon nitride ($SiN_x$) layer, and a silicon oxynitride (SiON) layer are alternately stacked. The buffer film may be omitted.

The thin film transistor 120 is formed on the buffer film BF. The thin film transistor 120 includes an active layer 121, a gate electrode 122, a source electrode 123, and a drain electrode 124. In FIG. 8, the thin film transistor 120 is illustrated as being formed as a top gate type in which the gate electrode 122 is disposed above the active layer 121, but the present disclosure is not limited thereto. That is, the thin film transistors 120 may be formed as a bottom gate type in which the gate electrode 122 is disposed below the active layer 121 or a double gate type in which the gate electrode 122 is disposed on both of upper and lower portions of the active layer 121.

The active layer 121 is formed on the buffer film BF. The active layer 121 may include polycrystalline silicon, single crystal silicon, low temperature polycrystalline silicon, amorphous silicon, or an oxide semiconductor. For example, the oxide semiconductor may include a binary compound ($AB_x$), a ternary compound ($AB_xC_y$), or a quaternary compound ($AB_xC_yD_z$), which includes indium, zinc, gallium, tin, titanium, aluminum, hafnium (Hf), zirconium (Zr), magnesium (Mg), or the like. For example, the active layer 121 may include ITZO (an oxide including indium, tin, and titanium) or IGZO (an oxide including indium, gallium, and tin). A light blocking layer configured to block external light incident on the active layer 121 may be formed between the buffer film and the active layer 121.

The gate insulating film 131 may be formed on the active layer 121. The gate insulating film 131 may be formed as an inorganic film, for example, a silicon nitride layer, a silicon oxynitride layer, a silicon oxide layer, a titanium oxide layer, or an aluminum oxide layer.

The gate electrode 122 and a gate line may be formed on the gate insulating film 131. The gate electrode 122 and the gate line may be formed as a single layer or a multi-layer made of one selected from among molybdenum (Mo), aluminum (Al), chromium (Cr), gold (Au), titanium (Ti), nickel (Ni), neodymium (Nd), copper (Cu), and an alloy thereof.

The first interlayer insulating film 132 may be formed on the gate electrode 122 and the gate line. The first interlayer insulating film 132 may be formed as an inorganic film, for example, a silicon nitride layer, a silicon oxynitride layer, a silicon oxide layer, a titanium oxide layer, or an aluminum oxide layer.

The source electrode 123 and the drain electrode 124 may be formed on the first interlayer insulating film 132. Each of the source electrode 123 and the drain electrode 124 may be connected to the active layer 121 through a contact hole passing through the gate insulating film 131 and the first interlayer insulating film 132. The source electrode 123 and the drain electrode 124 may be formed as a single layer or a multi-layer made of one selected from among molybdenum (Mo), aluminum (Al), chromium (Cr), gold (Au), titanium (Ti), nickel (Ni), neodymium (Nd), copper (Cu), and an alloy thereof.

The protective film 133 may be formed on the source electrode 123 and the drain electrode 124 to insulate the thin film transistor 120. The protective film 133 may be formed as an inorganic film, for example, a silicon nitride layer, a silicon oxynitride layer, a silicon oxide layer, a titanium oxide layer, or an aluminum oxide layer.

The second interlayer insulating film 134 may be formed on the protective film 133. The second interlayer insulating film 134 may be formed as an inorganic film, for example, a silicon nitride layer, a silicon oxynitride layer, a silicon oxide layer, a titanium oxide layer, or an aluminum oxide layer.

The connection electrode 151 may be formed on the second interlayer insulating film 134. The connection electrode 151 may be electrically connected to the drain electrode 124 through a contact hole passing through the second interlayer insulating film 134. The connection electrode 151 may serve to electrically connect the drain electrode 124 and a first electrode 141 of the light-emitting element layer EML which will be described below. The connection electrode 151 may be formed as a single layer or a multi-layer made of one selected from among molybdenum (Mo), aluminum (Al), chromium (Cr), gold (Au), titanium (Ti), nickel (Ni), neodymium (Nd), copper (Cu), and an alloy thereof.

The planarizing film 135 may be formed on the connection electrode 151 and the second interlayer insulating film 134 to planarize a stepped portion formed due to the thin film transistor 120. The planarizing film 135 may be formed as an organic film made of an acryl resin, an epoxy resin, a phenolic resin, a polyamide resin, a polyimide resin, or the like.

The light-emitting element layer EML may be formed on the thin film transistor layer TFTL. The light-emitting element layer EML includes light-emitting elements 140 and a pixel definition film 147.

The light-emitting elements 140 and the pixel definition film 147 are formed on the planarizing film 135. Each of the light-emitting elements 140 may include the first electrode 141, the light-emitting layer 143, and a second electrode 145.

The first electrode 141 may be formed on the planarizing film 135. The first electrode 141 is connected to the connection electrode 151 through a contact hole passing through the planarizing film 135. The first electrode 141 is electrically connected to the drain electrode 124 of the thin film transistor 120 through the connection electrode 151.

In a top emission structure in which light is emitted in the direction of the second electrode 145 with respect to the organic light-emitting layer 143, the first electrode 141 may be made of a metal material having high reflectivity, and for example, may include a stacked structure (Ti/Al/Ti) including aluminum and titanium, a stacked structure (ITO/Al/ITO) including aluminum and ITO, an silver-palladium-copper (APC) alloy, and a stacked structure (ITO/APC/ITO) including ITO and an APC alloy. The APC alloy is an alloy of silver (Ag), palladium (Pd), and copper (Cu).

In a bottom emission structure in which light is emitted in the direction of the first electrode 141 with respect to the organic light-emitting layer 143, the first electrode 141 may be made of a transparent conductive material (TCO) capable of transmitting light, such as ITO or IZO, or may be made of a semi-transmissive conductive material such as magnesium (Mg), silver (Ag), or an alloy of magnesium (Mg) and silver (Ag). In this case, when the first electrode 141 is made of the semi-transmissive conductive material, luminous efficiency may be improved due to a microcavity.

In order to serve to define subpixels, the pixel definition film 147 may be formed to partition the first electrode 141 on the planarizing film 135. The pixel definition film 147 may be formed to cover an edge of the first electrode 141. The pixel definition film 147 may be formed as an organic film made of an acryl resin, an epoxy resin, a phenolic resin, a polyamide resin, a polyimide resin, or the like.

Each of the subpixels refers to a region in which the first electrode 141, the light-emitting layer 143, and the second electrode 145 are sequentially stacked so that holes generated from the first electrode 141 and electrons generated from the second electrode 145 are combined with each other in light-emitting layer 143 to emit light.

The light-emitting layer 143 is formed on the first electrode 141 and the pixel definition film 147. The light-emitting layer 143 may include an organic material to emit certain color light. The light-emitting layer 143 may be an organic light-emitting layer that includes an organic material to emit certain color light. When the light-emitting layer 143 is a white light-emitting layer that emits white light, the light-emitting layer 143 may be a common layer commonly formed in the subpixels. In this case, the light-emitting layer 143 may be formed in a tandem structure having two or more stacks. Each of the stacks may include a hole transport layer, at least one light-emitting layer, and an electron transport layer.

In addition, a charge generation layer may be formed between the stacks. The charge generation layer may include an N-type charge generation layer positioned adjacent to a lower stack and a P-type charge generation layer formed on the N-type charge generation layer and positioned adjacent to an upper stack. The N-type charge generation layer injects electrons into the lower stack, and the P-type charge generation layer injects holes into the upper stack. The N-type charge generation layer may be an organic layer in which an organic host material having electron transport capability is doped with an alkali metal such as lithium (Li), sodium (Na), potassium (K), or cesium (Cs), or an alkaline earth metal such as magnesium (Mg), strontium (Sr), barium (Ba), or radium (Ra). The P-type charge generation layer may be an organic layer in which an organic host material having hole transport capability is doped with a dopant.

The second electrode 145 is formed on the light-emitting layer 143. The second electrode 145 may be formed to cover the light-emitting layer 143. The second electrode 145 may be a common layer commonly formed in the pixels P. A capping layer may be formed on the second electrode 145.

In a top emission structure, the second electrode 145 may be made of a transparent conductive material (TCO) capable of transmitting light such as ITO or IZO or may be made of a semi-transmissive conductive material such as magnesium (Mg), silver (Ag), or an alloy of magnesium (Mg) and silver (Ag). When the second electrode 145 is made of the semi-transmissive conductive material, luminous efficiency may be improved due to a microcavity.

In a bottom emission structure, the second electrode 145 may be made of a metal material having high reflectivity and, for example, may include a stacked structure (Ti/Al/Ti) including aluminum and titanium, a stacked structure (ITO/Al/ITO) including aluminum and ITO, an APC alloy, and a stacked structure (ITO/APC/ITO) of ITO and an APC alloy. The APC alloy is an alloy of silver (Ag), palladium (Pd), and copper (Cu).

The thin film encapsulation layer TFEL is formed on the light-emitting element layer EML. The thin film encapsulation layer TFEL includes an encapsulation film 160.

The encapsulation film 160 is disposed on the second electrode 145. The encapsulation film 160 may include at least one inorganic film and at least one organic film so as to prevent or reduce oxygen or moisture from permeating into the light-emitting layer 143 and the second electrode 145.

The encapsulation film 160 may include a first inorganic film 161, a second inorganic film 163, and an organic film 162 interposed between the first inorganic film 161 and the second inorganic film 163. Each of the first inorganic film 161 and the second inorganic film 163 may be made of silicon nitride, aluminum nitride, zirconium nitride, titanium nitride, hafnium nitride, tantalum nitride, silicon oxide, aluminum oxide, or titanium oxide. The first inorganic film 161 and the second inorganic film 163 may be made of the same material, but the present disclosure is not limited thereto and the first inorganic film 161 and the second inorganic film 163 may be made of different materials.

The organic film 162 may be formed to have a sufficient thickness, for example, a thickness ranging from 7 μm to 8 μm so as to prevent particles from passing through the encapsulation film 160 and penetrating into the light-emitting layer 143 and the second electrode 145. The organic film 162 may be made of a polymerized monomer composition including a diacrylate-based monomer and a triacrylate-based monomer, an acrylic resin, an epoxy resin, a phenolic resin, a polyamide resin, a polyimide resin, or the like, but the present disclosure is not limited thereto.

The sensing layer TSL is formed on the thin film encapsulation layer TFEL. The first sensing electrodes TE, the second sensing electrodes RE, the connection electrodes BE, the first sensing lines TL1, the second sensing lines TL2, the third sensing lines RL, a sensor insulating film 170, the guard lines, and the ground lines may be disposed in the sensing layer TSL. For convenience of description, only the first sensing electrodes TE, second sensing electrodes RE, connection electrodes BE, and sensor insulating film 170 of the sensing layer TSL are illustrated in FIG. 8.

The first sensing electrodes TE and the second sensing electrodes RE may be disposed on the same layer, and the connection electrodes BE may be disposed on a layer different from the first sensing electrodes TE and the second sensing electrodes RE. The first sensing electrodes TE and the second sensing electrodes RE are spaced apart from each other and electrically insulated from each other.

The connection electrodes BE may be formed on the second inorganic film 163 of the encapsulation film 160. The connection electrodes BE may be formed as a single layer or a multi-layer made of one selected from among molybdenum (Mo), aluminum (Al), chromium (Cr), gold (Au), titanium (Ti), nickel (Ni), neodymium (Nd), copper (Cu), and an alloy thereof.

The sensor insulating film 170 may be formed on the connection electrodes BE. The sensor insulating film 170 may be formed as an inorganic film, for example, a silicon oxide ($SiO_x$) film, a silicon nitride ($SiN_x$) film, or a multi-layer film thereof.

The first sensing electrodes TE and the second sensing electrodes RE may be formed on the sensor insulating film 170. The first sensing electrodes TE may be connected to the connection electrodes BE through first contact holes CT1 passing through the sensor insulating film 170 to expose the connection electrodes BE. Accordingly, since the first sensing electrodes TE are connected using the connection electrodes BE in the intersection regions of the first sensing electrodes TE and the second sensing electrodes RE, the first sensing electrodes TE and the second sensing electrodes RE are not short-circuited to each other. In addition, the first sensing electrodes TE and the second sensing electrodes RE may be disposed to overlap the pixel definition film 147 so as to prevent an open region of the subpixel from being reduced.

As described above, the first sensing lines TL1 and the second sensing lines TL2 may extend from the first sensing electrodes TE, and the third sensing lines RL may extend from the second sensing electrodes RE.

The first sensing electrodes TE, the second sensing electrodes RE, the first and second sensing lines TL1 and TL2, and the third sensing lines RL may be formed as a single layer or a multi-layer made of one selected from among molybdenum (Mo), aluminum (Al), chromium (Cr), gold (Au), titanium (Ti), nickel (Ni), neodymium (Nd), copper (Cu), and an alloy thereof.

An overcoat layer may be formed on the first sensing electrodes TE and the second sensing electrodes RE to planarize a stepped portion formed due to the first sensing electrodes TE, the second sensing electrodes RE, and the connection electrodes BE.

Figure 9:
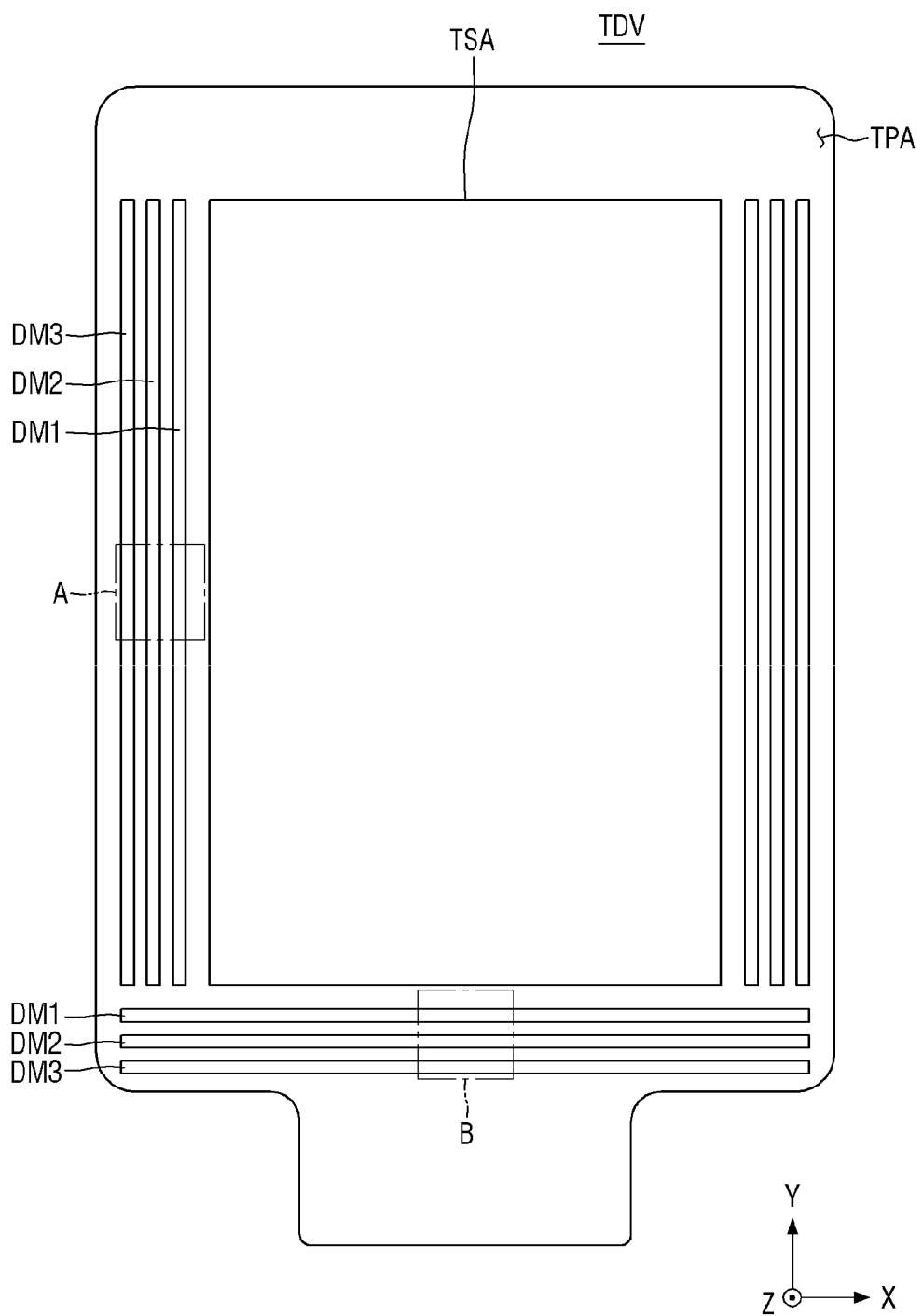
FIG. 9 is a plan view illustrating an example of a dam arrangement of the display device.
Figure 10:
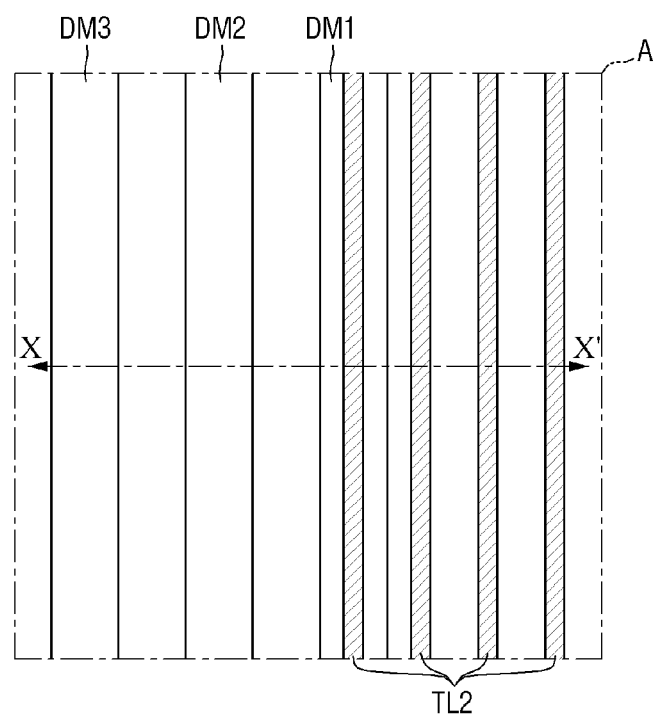
FIG. 10 is an enlarged view illustrating an example in which region A of FIG. 9 is enlarged.
Figure 11:
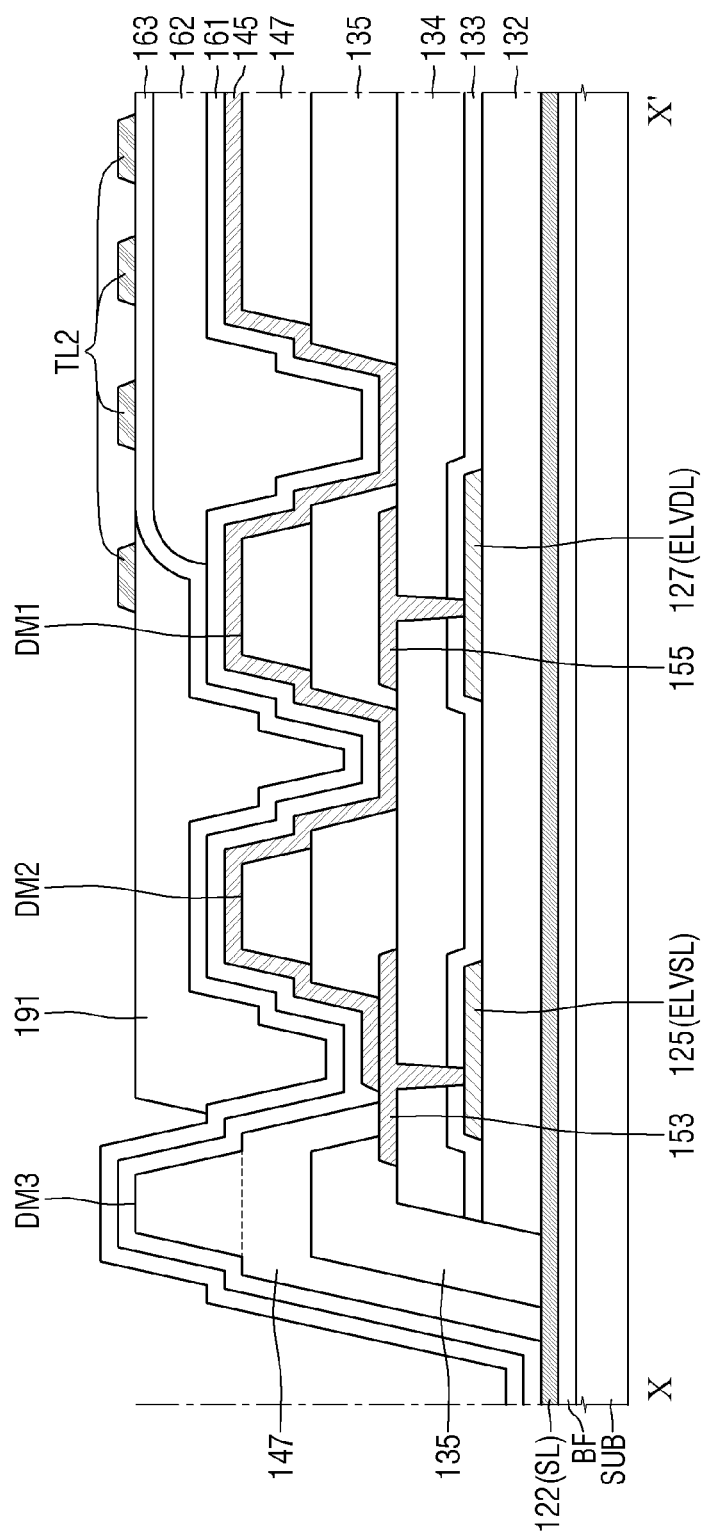
FIG. 11 is a cross-sectional view of an example which is taken along line X-X' of FIG. 10.

FIG. 9 is a plan view illustrating an example of a dam arrangement of the display device. FIG. 10 is an enlarged view illustrating an example in which region A of FIG. 9 is enlarged. FIG. 11 is a cross-sectional view of an example which is taken along line X-X' of FIG. 10.

Referring to FIGS. 9, 10, and 11, the display panel 100 further includes a plurality of dams DM1, DM2, and DM3. The dams DM1, DM2, and DM3 may be disposed outside an edge of the display area DA of the display panel 100. That is, the plurality of dams DM1, DM2, and DM3 may be disposed in the non-display area NDA.

The plurality of dams DM1, DM2, and DM3 may include an inner dam DM1, a middle dam DM2, and an outermost dam DM3. The middle dam DM2 may be disposed between the inner dam DM1 and the outermost dam DM3. The inner dam DM1 may be disposed between the middle dam DM2, which is disposed in the non-display area NDA, and the display area DA. That is, the inner dam DM1 may be disposed in the non-display area NDA and disposed close to a display area DA and the outermost dam DM3 may be disposed in the non-display area NDA and disposed at an outermost side from the display area DA, and the middle dam DM2 may be disposed between the inner dam DM1 and the outermost dam DM3. The plurality of dams DM1, DM2, and DM3 may be disposed to be spaced apart from each other.

The plurality of dams DM1, DM2, and DM3 disposed in the non-display area NDA may be disposed at a left side, a right side, and a lower side of the display panel 100 in a plan view.

In the non-display area NDA, the plurality of dams DM1, DM2, and DM3 disposed at the left side and the right side of the display panel 100 may have shapes which extend in one direction in a plan view. Specifically, the plurality of dams DM1, DM2, and DM3 disposed in a first non-display area NDA disposed adjacent to a first long side (left side in FIG. 9) of the display panel 100 and a second non-display area NDA disposed adjacent to a second long side (right side in FIG. 9) of the display panel 100 may have shapes which extend in the second direction (Y-axis direction). The plurality of dams DM1, DM2, and DM3 disposed in the first and second non-display areas NDA may be disposed to be spaced apart from each other in the first direction (X-axis direction).

In the non-display area NDA, the plurality of dams DM1, DM2, and DM3 disposed at the lower side of the display panel 100 may have shapes which extend in one direction in a plan view. Specifically, the plurality of dams DM1, DM2, and DM3 disposed in a third non-display area NDA disposed adjacent to a first short side (lower side in FIG. 9) of the display panel 100 may have shapes which extend in the first direction (X-axis direction). In the third non-display area NDA, the plurality of dams DM1, DM2, and DM3 disposed at the lower side of the display panel 100 may be disposed to be spaced apart from each other in the second direction (Y-axis direction).

The inner dam DM1 disposed in the first non-display area NDA, the inner dam DM1 disposed in the second non-display area NDA, and the inner dam DM1 disposed in the third non-display area NDA may be formed to be spaced apart from each other. However, the present disclosure is not limited thereto, and the inner dams DM1 disposed in the first non-display area NDA, the second non-display area NDA, and the third non-display area NDA may also be integrally formed.

The middle dam DM2 disposed in the first non-display area NDA, the middle dam DM2 disposed in the second non-display area NDA, and the middle dam DM2 disposed in the third non-display area NDA may be formed to be spaced apart from each other. However, the present disclosure is not limited thereto, and the middle dams DM2 disposed in the first non-display area NDA, the second non-display area NDA, and the third non-display area NDA may also be integrally formed.

The outermost dam DM3 disposed in the first non-display area NDA, the outermost dam DM3 disposed in the second non-display area NDA, and the outermost dam DM3 disposed in the third non-display area NDA may be formed to be spaced apart from each other. However, the present disclosure is not limited thereto, and the outermost dams DM3 disposed in the first non-display area NDA, the second non-display area NDA, and the third non-display area NDA may also be integrally formed.

Referring to FIG. 10, the plurality of dams DM1, DM2, and DM3 disposed in the first non-display area NDA and the second sensing lines TL2 among the sensing lines TL1, TL2, and RL disposed in the sensing peripheral area TPA may have shapes which extend parallel to each other in one direction. Specifically, the plurality of dams DM1, DM2, and DM3 disposed in the first non-display area NDA and a plurality of second sensing lines TL2 disposed in the first non-display area NDA may have shapes which extend in the second direction (Y-axis).

The inner dam DM1 disposed in the first non-display area NDA may overlap at least one of the second sensing lines TL2 in a third direction (Z-axis direction). In FIG. 10, the inner dam DM1 disposed in the first non-display area NDA of the display panel 100 is illustrated as overlapping one second sensing line TL2 disposed at an outermost side among the second sensing lines TL2, but the present disclosure is not limited thereto. For example, the inner dam DM1 disposed in the first non-display area NDA may also overlap the plurality of second sensing lines TL2 in the third direction (Z-axis direction).

Hereinafter, a cross-sectional structure of the display panel 100 disposed in the non-display area NDA will be described with reference to FIG. 11. In the cross-sectional structure of the non-display area NDA, detailed descriptions of layers which are the same as those of the cross-sectional structure of the display panel 100 in the display area DA of FIG. 8 are partially replaced with those given with reference to FIG. 8.

Referring to FIGS. 8 and 11, the buffer film BF may be formed on one surface of the substrate SUB in the non-display area NDA of the display device 10. The buffer film BF may be formed on an entire surface of the substrate SUB in the display area DA and the non-display area NDA to protect a first power line 127 and a second power line 125 to be described below and protect the organic light-emitting layer 143 of the light-emitting element layer EML from moisture permeating through the substrate SUB which is vulnerable to moisture transmission. The detailed description of the buffer film BF will be replaced with the description of the buffer film BF in the display area DA of FIG. 8. The buffer film BF may be omitted.

The gate insulating film 131 may be formed on the buffer film BF in the non-display area NDA. The gate insulating film 131 may be disposed on an entire surface of the buffer film BF in the display area DA and the non-display area NDA. The gate insulating film 131 may be formed as an inorganic film, for example, a silicon nitride layer, a silicon oxynitride layer, a silicon oxide layer, a titanium oxide layer, or an aluminum oxide layer.

The gate line 122(SL) may be formed on the gate insulating film 131 and/or buffer film BF in the non-display area NDA. The gate line may be formed as a single layer or a multi-layer made of one selected from among molybdenum (Mo), aluminum (Al), chromium (Cr), gold (Au), titanium (Ti), nickel (Ni), neodymium (Nd), copper (Cu), and an alloy thereof. The gate line 122(SL) may be formed of a sensing line or a scan line.

The first interlayer insulating film 132 may be formed on the gate line 122(SL) in the non-display area NDA. The first interlayer insulating film 132 in the non-display area NDA may be disposed to expose at least a portion of the gate line 122(SL). That is, the first interlayer insulating film 132 in the non-display area NDA may have an upper surface and a side surface. The first interlayer insulating film 132 may be formed as an inorganic film, for example, a silicon nitride layer, a silicon oxynitride layer, a silicon oxide layer, a titanium oxide layer, or an aluminum oxide layer.

The first power line 127 and the second power line 125 may be formed on the first interlayer insulating film 132 in the non-display area NDA. The first power line 127 and the second power line 125 may be formed on the same layer as the source electrode 123 and the drain electrode 124 in the display area DA. The first power line 127 and the second power line 125 may be spaced apart from each other. The first power line 127 and the second power line 125 may be formed as a single layer or a multi-layer made of one selected from among molybdenum (Mo), aluminum (Al), chromium (Cr), gold (Au), titanium (Ti), nickel (Ni), neodymium (Nd), copper (Cu), and an alloy thereof.

A high potential voltage (first power voltage) may be supplied to the first power line 127, and a low potential voltage (that is, a second power voltage) lower than the first power voltage of the first power line 127 may be supplied to the second power line 125. The second power line 125 may be electrically connected to the second electrode 145 of the light-emitting element 140 through a second power connection electrode 153 which will be described below. The second power line 125 may supply the second power voltage to the second electrode 145 of the light-emitting element 140.

The protective film 133 may be formed on the first interlayer insulating film 132 in the non-display area NDA. The protective film 133 in the non-display area NDA may have an upper surface and a side surface. In the non-display area NDA, the side surface of the protective film 133 may be aligned with the side surface of the first interlayer insulating film 132.

The second interlayer insulating film 134 may be formed on the protective film 133 in the non-display area NDA. The second interlayer insulating film 134 in the non-display area NDA may have an upper surface and a side surface. In the non-display area NDA, the side surface of the second interlayer insulating film 134 may be aligned with the side surfaces of the first interlayer insulating film 132 and the protective film 133. The second interlayer insulating film 134 may be formed as an inorganic film, for example, a silicon nitride layer, a silicon oxynitride layer, a silicon oxide layer, a titanium oxide layer, or an aluminum oxide layer.

The second power connection electrode 153 and a first power connection electrode 155 may be formed on the second interlayer insulating film 134 in the non-display area NDA. The second power connection electrode 153 and the first power connection electrode 155 may be formed on the same layer as the connection electrode 151 in the display area DA. The second power connection electrode 153 and the first power connection electrode 155 may be formed as a single layer or a multi-layer made of one selected from among molybdenum (Mo), aluminum (Al), chromium (Cr), gold (Au), titanium (Ti), nickel (Ni), neodymium (Nd), copper (Cu), and an alloy thereof.

The first power connection electrode 155 may be disposed on the second interlayer insulating film 134 so as to overlap the first power line 127. The first power connection electrode 155 may be electrically connected to the first power line 127 through a contact hole passing through the second interlayer insulating film 134. The first power connection electrode 155 may be connected to the first power line 127 to increase an area thereof, thereby serving to lower resistance.

The second power connection electrode 153 may be disposed on the second interlayer insulating film 134 so as to overlap the second power line 125. The second power connection electrode 153 may be electrically connected to the second power line 125 through a contact hole passing through the second interlayer insulating film 134. The second power connection electrode 153 may be exposed in a thickness direction of the display device 10 by the patterned planarizing film 135. The second electrode 145 of the light-emitting element 140 may be disposed on the second power connection electrode 153 exposed by the planarizing film 135 and thus may be in physical contact with the second power connection electrode 153. The second electrode 145 of the light-emitting element 140 may receive the second power voltage supplied to the second power line 125 through the second power connection electrode 153.

The patterned planarizing film 135 may be formed on the second interlayer insulating film 134 in the non-display area NDA. The patterned planarizing film 135 disposed on the second interlayer insulating film 134 in the non-display area NDA may include first to fourth planarizing films 135.

The first planarizing film 135 may overlap at least a portion of the second power connection electrode 153, may expose at least a portion of the second power connection electrode 153, and may be disposed to completely cover the side surfaces of the first interlayer insulating film 132 and the second interlayer insulating film 134. The second planarizing film 135 may overlap at least a portion of the second power connection electrode 153, may expose at least a portion of the second power connection electrode 153, and may be disposed on an upper surface of the first interlayer insulating film 132 so as to be spaced apart from the first power connection electrode 155. The third planarizing film 135 may be disposed to completely cover the first power connection electrode 155. The fourth planarizing film 135 may be a planarizing film which is disposed to extend from the patterned planarizing film 135 in the display area DA.

The first planarizing film 135, the second planarizing film 135, and the third planarizing film 135 may form the outermost dam DM3, the middle dam DM2, and the inner dam DM1 which will be described below. The planarizing film 135 may be formed as an organic film made of an acryl resin, an epoxy resin, a phenolic resin, a polyamide resin, a polyimide resin, or the like.

The patterned pixel definition film 147 may be formed on the planarizing film 135 in the non-display area NDA. The pixel definition film 147 in the non-display area NDA may be disposed on an upper surface of the planarizing film 135. The pixel definition film 147 in the non-display area NDA may include first to fourth pixel definition films 147.

The first pixel definition film 147 may be formed on the first planarizing film 135, the second pixel definition film 147 may be formed on the second planarizing film 135, the third pixel definition film 147 may be formed on the third planarizing film 135, and the fourth pixel definition film 147 may be formed on the fourth planarizing film 135. The pixel definition film 147 may be formed as an organic film made of an acryl resin, an epoxy resin, a phenolic resin, a polyamide resin, a polyimide resin, or the like.

The first, second, and fourth pixel definition films 147 may be disposed on the first, second, and fourth planarizing films 135 and may be disposed to expose at least a portion of the upper surface of the planarizing film 135. However, the present disclosure is not limited thereto, and the first, second, and fourth pixel definition films 147 may extend to two sides to completely cover upper surfaces of the first, second, and fourth planarizing films 135 and thus may be formed to completely cover side surfaces of the first, second, and fourth planarizing films 135.

The third pixel definition film 147 may be disposed on the third planarizing film 135 and thus may be formed to cover an upper surface and side surfaces of the third planarizing film 135. The third pixel definition film 147 may have a surface stepped portion having a thickness different from that of the first pixel definition film 147, the second pixel definition film 147, and the fourth pixel definition film 147. For example, the third pixel definition film 147 disposed at an outermost side of the non-display area NDA may include a second section which has a thickness greater than that of a first section thereof. A thickness of the third pixel definition film 147 in the first section of the third pixel definition film 147 may be the same as a thickness of the first, second, and third pixel definition films 147, and a thickness of the third pixel definition film 147 in the second section of the third pixel definition film 147 may be greater than the thickness of the first, second, and third pixel definition films 147. The third pixel definition film 147 may be formed to have the second section which has the thickness greater than the thickness of the first, second, and third pixel definition films 147, thereby preventing an overflowing phenomenon of the organic film 162 of the encapsulation film 160 which will be described below.

The first planarizing film 135 and the first pixel definition film 147 disposed in the non-display area NDA may form the inner dam DM1. The second planarizing film 135 and the second pixel definition film 147 disposed in the non-display area NDA may form the middle dam DM2. The third planarizing film 135 and the third pixel definition film 147 disposed in the non-display area NDA may form the outermost dam DM3.

The inner dam DM1, the middle dam DM2, and the outermost dam DM3 disposed in the non-display area NDA may be disposed to be spaced apart from each other. Trench structures may be formed in separation spaces between the inner dam DM1, the middle dam DM2, and the outermost dam DM3, thereby preventing an overflowing phenomenon of the organic film 162 of the encapsulation film 160 which will be described below.

The second electrode 145 of the light-emitting element 140 may be disposed on the pixel definition film 147 in the non-display area NDA. The second electrode 145 of the light-emitting element 140 may be disposed on an entire surface of the pixel definition film 147 in the display area DA. As described above, the second electrode 145 may be disposed to extend from the display region DA to the non-display area NDA so as to be disposed on the second power connection electrode 153 in the non-display area NDA.

The second electrode 145 may be disposed on the inner dam DM1 and the middle dam DM2 so as to overlap the inner dam DM1 and the middle dam DM2 in a thickness direction thereof. The second electrode 145 may be disposed so as to not overlap the outermost dam DM3. Accordingly, the second electrode 145 may extend from the display area DA to the non-display area NDA and thus may be disposed on a trench formed between the outermost dam DM3 and the middle dam DM2 in the non-display area NDA.

The first inorganic film 161 of the encapsulation film 160 is formed on the second electrode 145 and the pixel definition film 147 exposed by the second electrode 145 in the non-display area NDA. The first inorganic film 161 may be disposed in the entirety of the display area DA and the non-display area NDA so as to completely cover the light-emitting layer 143.

The organic film 162 may be disposed on the first inorganic film 161 in the non-display area NDA. The organic film 162 in the non-display area NDA may be disposed to overlap at least a portion of the inner dam DM1. The organic film 162 in the non-display area NDA may not overlap the middle dam DM2 and the outermost dam DM3.

The second inorganic film 163 in the non-display area NDA may be disposed on the organic film 162 and the first inorganic film 161 exposed by the organic film 162. The first inorganic film 161 and the second inorganic film 163 in the non-display area NDA may be disposed to be spaced apart from each other in a thickness direction thereof in a region in which the organic film 162 is interposed between the first inorganic film 161 and the second inorganic film 163. The first inorganic film 161 and the second inorganic film 163 in the non-display area NDA may be disposed to be in contact with each other in a region in which the organic film 162 is not interposed between the first inorganic film 161 and the second inorganic film 163. Specifically, the second inorganic film 163 is disposed on an upper surface of the first inorganic film 161 exposed by the organic film 162 on the inner dam DM1, the middle dam DM2, and the outermost dam DM3.

An outer planarizing layer 191 is formed on the second inorganic film 163 disposed on the inner dam DM1 and the middle dam DM2. The outer planarizing layer 191 may be disposed above the inner dam DM1 and the middle dam DM2 to completely cover the inner dam DM1 and the middle dam DM2. The outer planarizing layer 191 may not overlap the outermost dam DM3.

In one exemplary embodiment, the outer planarizing layer 191 may be formed such that an upper surface of the outer planarizing layer 191 is disposed to be coplanar with an upper surface of the second inorganic film 163 of the encapsulation film 160. The outer planarizing layer 191 may prevent a phenomenon in which the organic film 162 overflows to the outermost dam DM3, and the sensing lines TL1, TL2, and TL3 to be described below may be disposed above the inner dam DM1 or the middle dam DM2 on which the organic film 162 is not disposed, thereby preventing a mutual influence due to coupling between the second electrode 145 and the sensing lines TL1, TL2, and RL.

The outer planarizing layer 191 may include an acrylic-based, epoxy-based, or siloxane-based organic insulating material having high planarization performance.

The second sensing lines TL2 may be disposed on upper surfaces of the outer planarizing layer 191 and the second inorganic film 163 on the organic film 162. The second sensing line TL2 may be formed on the same layer as the first sensing electrode TE and the second sensing electrode RE. The second sensing lines TL2 disposed on the outer planarizing layer 191 and the organic film 162 may be disposed to be spaced apart from each other.

The second sensing line TL2 disposed on the outer planarizing layer 191 may be disposed to overlap the inner dam DM1. The second sensing line TL2 disposed on the outer planarizing layer 191 may be disposed to not overlap the middle dam DM2 and the outermost dam DM3.

Figure 12:
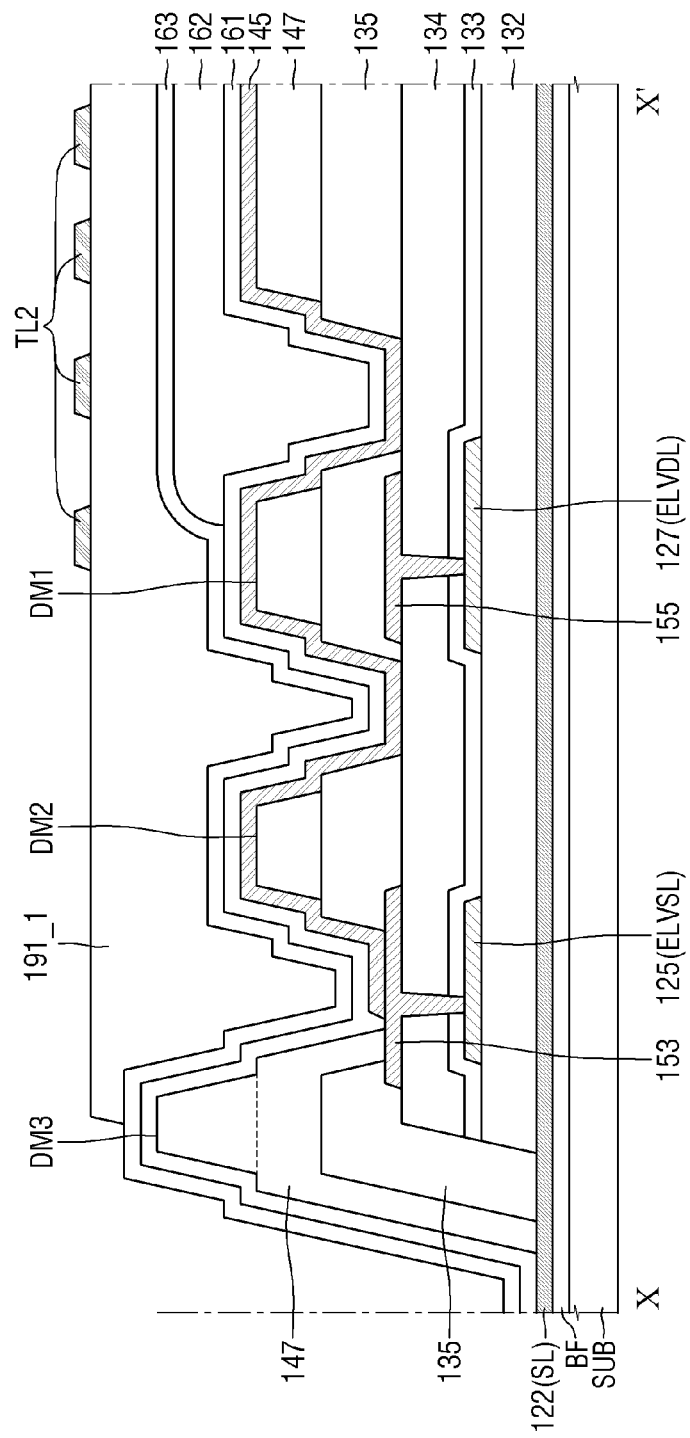
FIG. 12 is a cross-sectional view of another example which is taken along line X-X' of FIG. 10.

FIG. 12 is a cross-sectional view of another example which is taken along line X-X' of FIG. 10.

The exemplary embodiment of FIG. 12 is different from the exemplary embodiment of FIG. 11 in that an outer planarizing layer at least partially overlaps the outermost dam DM3 and is disposed on the organic film 162.

Referring to FIG. 12, an outer planarizing layer 191_1 disposed in the first non-display area NDA is disposed on an entire surface of the second inorganic film 163 such that a portion of the second inorganic film 163 disposed on an upper surface of the outermost dam DM3 is exposed in the thickness direction of the display device 10.

Specifically, the outer planarizing layer 191_1 disposed in the first non-display area NDA may be disposed above entire surfaces of the inner dam DM1 and the middle dam DM2 and may extend outward to be disposed even above the upper surface of the outermost dam DM3. In the drawing, the outer planarizing layer 191_1 disposed in the first non-display area NDA is disposed to expose at least a portion of the upper surface of the second inorganic film 163 disposed on the upper surface of the outermost dam DM3. However, the present disclosure is not limited thereto, and the outer planarizing layer 191_1 may be disposed to completely cover the outermost dam DM3.

The outer planarizing layer 191_1 disposed in the first non-display area NDA may be disposed on the organic film 162. The outer planarizing layer 191_1 may be disposed on an entire surface of the second inorganic film 163 disposed on an upper surface of the organic film 162 so as to overlap the organic film 162 in a thickness direction thereof. Therefore, in the present exemplary embodiment, the second sensing lines TL2 may be disposed on an upper surface of the outer planarizing layer 191_1.

Figure 13:
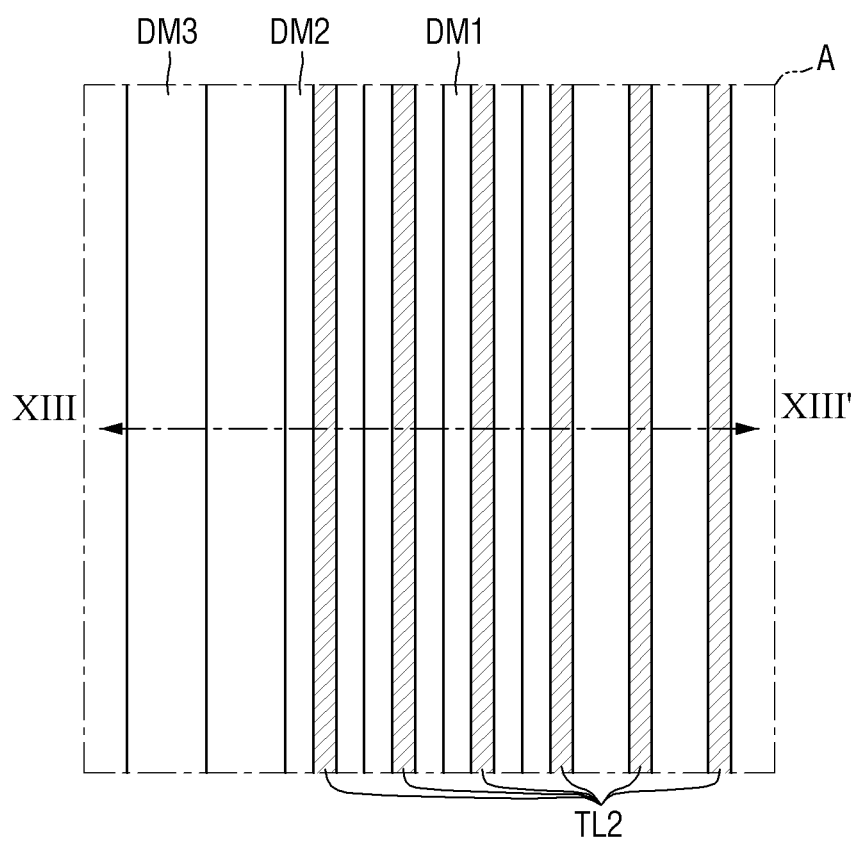
FIG. 13 is an enlarged view illustrating another example in which region A of FIG. 9 is enlarged.
Figure 14:
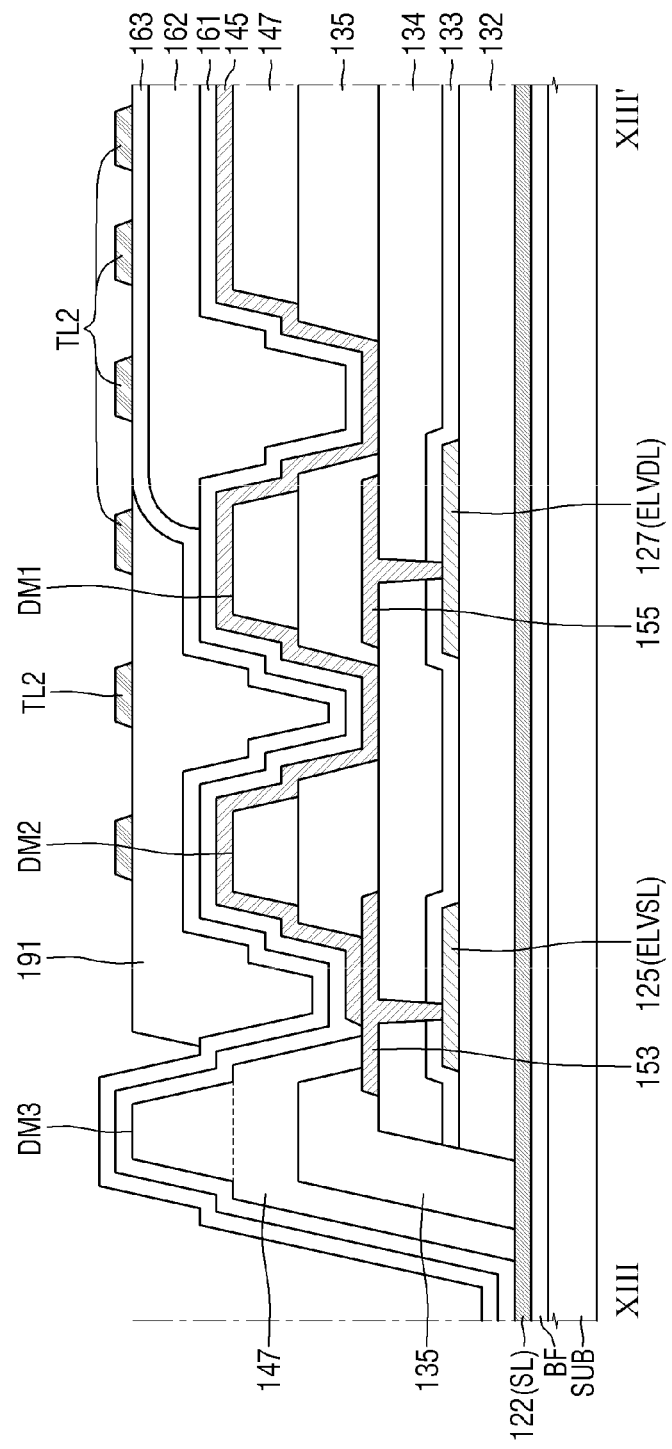
FIG. 14 is a cross-sectional view of an example which is taken along line XIII-XIII' of FIG. 13.

FIG. 13 is an enlarged view illustrating another example in which region A of FIG. 9 is enlarged. FIG. 14 is a cross-sectional view of an example which is taken along line XIII-XIII' of FIG. 13. The exemplary embodiment of FIGS. 13 and 14 is different from the exemplary embodiment of FIGS. 10 and 11 in that the second sensing line TL2 disposed in the non-display area NDA is disposed even above the middle dam DM2.

Referring to FIGS. 13 and 14, the second sensing line TL2 may be further disposed above the middle dam DM2 and disposed in a region overlapping a separation space between the middle dam DM2 and the inner dam DM1. Therefore, the second sensing line TL2 may be disposed on an upper surface of the outer planarizing layer 191 that overlaps the middle dam DM2. Even in this case, the outer planarizing layer 191, the first inorganic film 161, and the second inorganic film 163 may be interposed between the second electrode 145 disposed on the middle dam DM2 and the second sensing line TL2 disposed above the middle dam DM2, and thus, the second electrode 145 and the second sensing line TL2 may be insulated from each other. In the present exemplary embodiment, although the organic film 162 of the encapsulation film 160 is not disposed to extend to a region overlapping the second sensing line TL2 disposed in the first non-display area NDA, the outer planarizing layer 191 may be disposed to utilize the first non-display area NDA.

Figure 15:
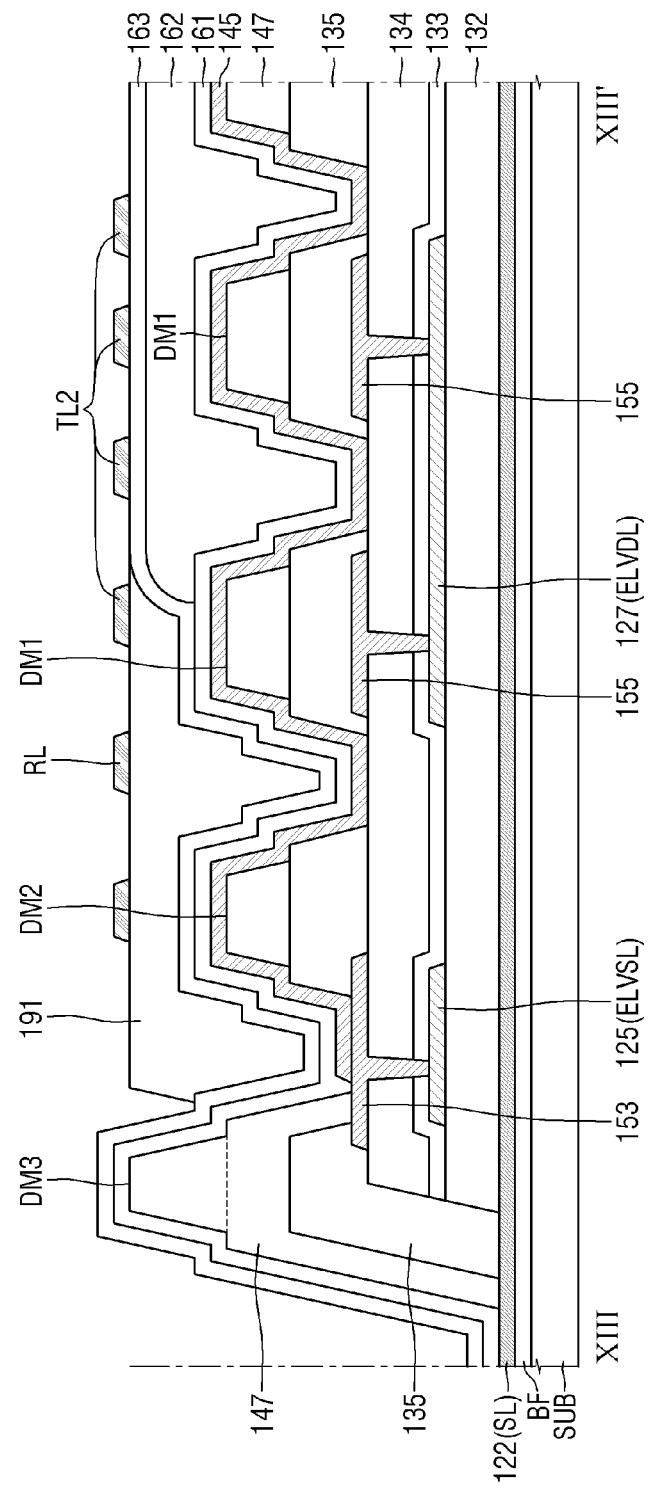
FIG. 15 is a cross-sectional view of another example which is taken along line XIII-XIII' of FIG. 13.

FIG. 15 is a cross-sectional view of another example which is taken along line XIII-XIII' of FIG. 13. The exemplary embodiment of FIG. 15 is different from the exemplary embodiment of FIG. 14 in that a plurality of inner dams DM1 may be formed.

Referring to FIG. 15, the inner dam DM1 may be provided with the plurality of inner dams DM1. The inner dams DM1 may be formed by arranging the first power connection electrodes 155 to be spaced apart from each other and patterning the planarizing film 135 and the pixel definition film 147 on the first power connection electrodes 155.

The plurality of inner dams DM1 may be disposed to be spaced apart from each other. At least one of the plurality of inner dams DM1 may completely overlap the organic film 162 in a thickness direction thereof. In the case of the present exemplary embodiment, the plurality of inner dams DM1 may be formed in a region overlapping the organic film 162, thereby preventing the organic film 162 from overflowing to the outside of the display device 10.

Figure 16:
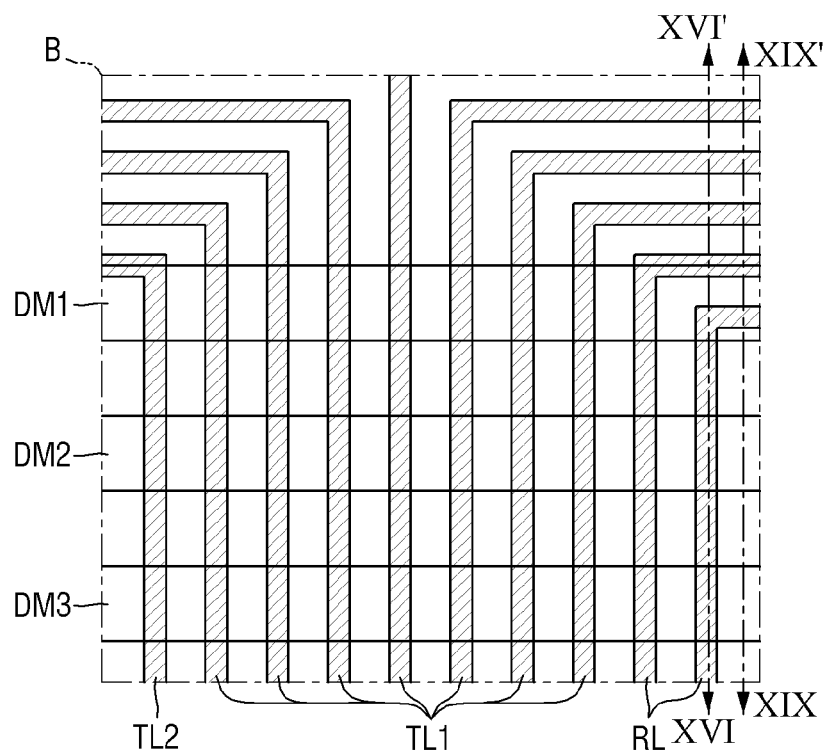
FIG. 16 is an enlarged view illustrating region B of FIG. 9.
Figure 17:
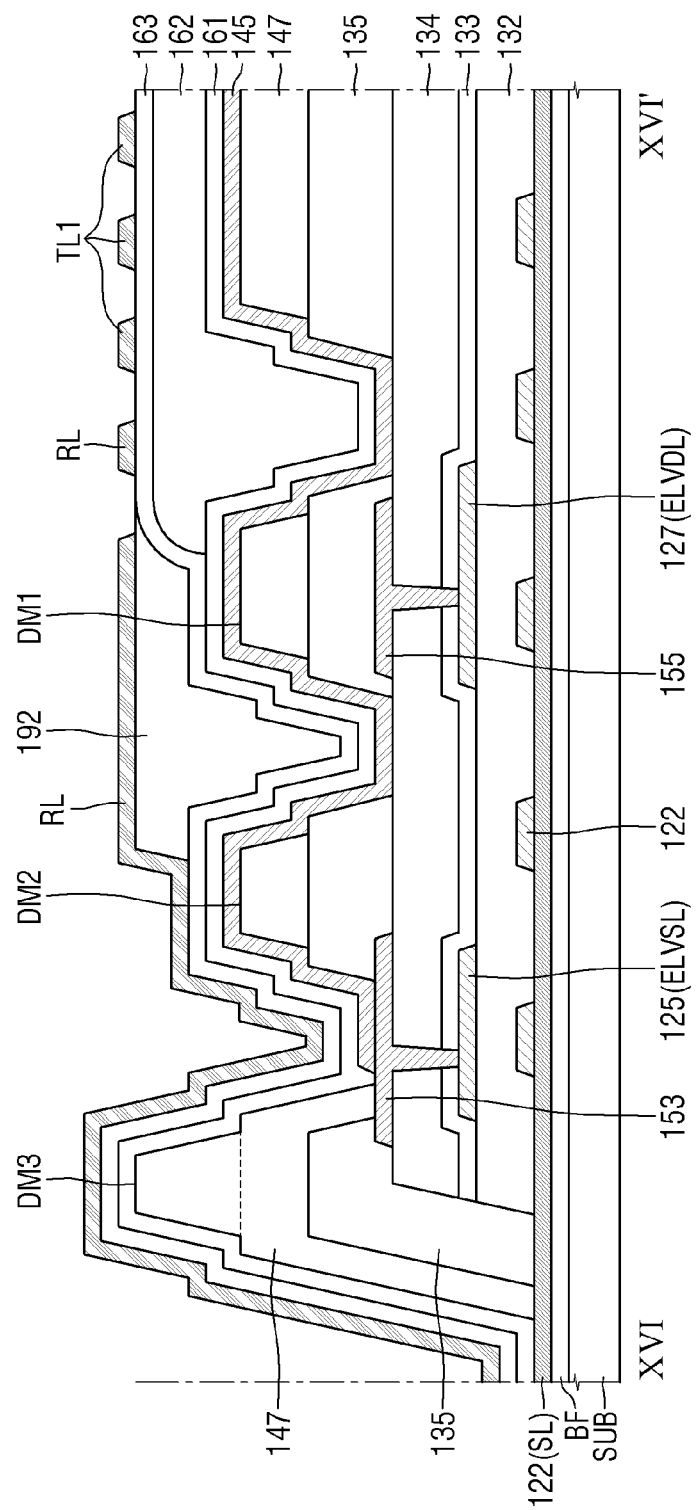
FIG. 17 is a cross-sectional view of an example which is taken along line XVI-XVI' of FIG. 16.

FIG. 16 is an enlarged view illustrating region B of FIG. 9. FIG. 17 is a cross-sectional view of an example which is taken along line XVI-XVI' of FIG. 16.

Referring to FIGS. 16 and 17, as described above, the plurality of dams DM1, DM2, and DM3 disposed in the third non-display area NDA may have shapes which extend in the first direction (X-axis direction). The sensing lines TL1, TL2, and RL disposed in the third non-display area NDA may be bent in the second direction (Y-axis direction) at one end portions thereof extending in the first direction (X-axis direction). Accordingly, the plurality of dams DM1, DM2, and DM3 may be perpendicular in an extending direction to the sensing lines TL1, TL2, and RL disposed in the third non-display area NDA. Accordingly, the other end portions of the sensing lines TL1, TL2, and RL disposed in the third non-display area NDA may extend to be connected to the pads.

An outer planarizing layer 192 disposed in the third non-display area NDA may be disposed above the inner dam DM1 and may be disposed to expose an upper surface of the middle dam DM2. The outer planarizing layer 192 disposed in the third non-display area NDA may not overlap at least a portion of the middle dam DM2 and the outermost dam DM3.

The third sensing line RL may be disposed above the inner dam DM1 corresponding to the outer planarizing layer 192 disposed in the third non-display area NDA. The third sensing line RL may be disposed on the outer planarizing layer 192 so as to overlap the inner dam DM1, the middle dam DM2, and the outermost dam DM3 in the thickness direction of the display device 10. Although not shown, the third sensing line RL may be disposed on side surfaces and an upper surface of the outermost dam DM3 and may extend to be connected to the sensing pads TP. When the outer planarizing layer 192 is disposed above the outermost dam DM3 disposed in the third non-display area NDA, a high step difference may occur, and thus, the third sensing line RL may be disconnected. Accordingly, in the third non-display area NDA, the outermost dam DM3 and the outer planarizing layer 192 disposed in the third non-display area NDA may be formed so as to not overlap each other, thereby preventing the sensing lines TL1, TL2, and RL disposed adjacent to the third non-display area NDA from being short-circuited to each other.

Figure 18:
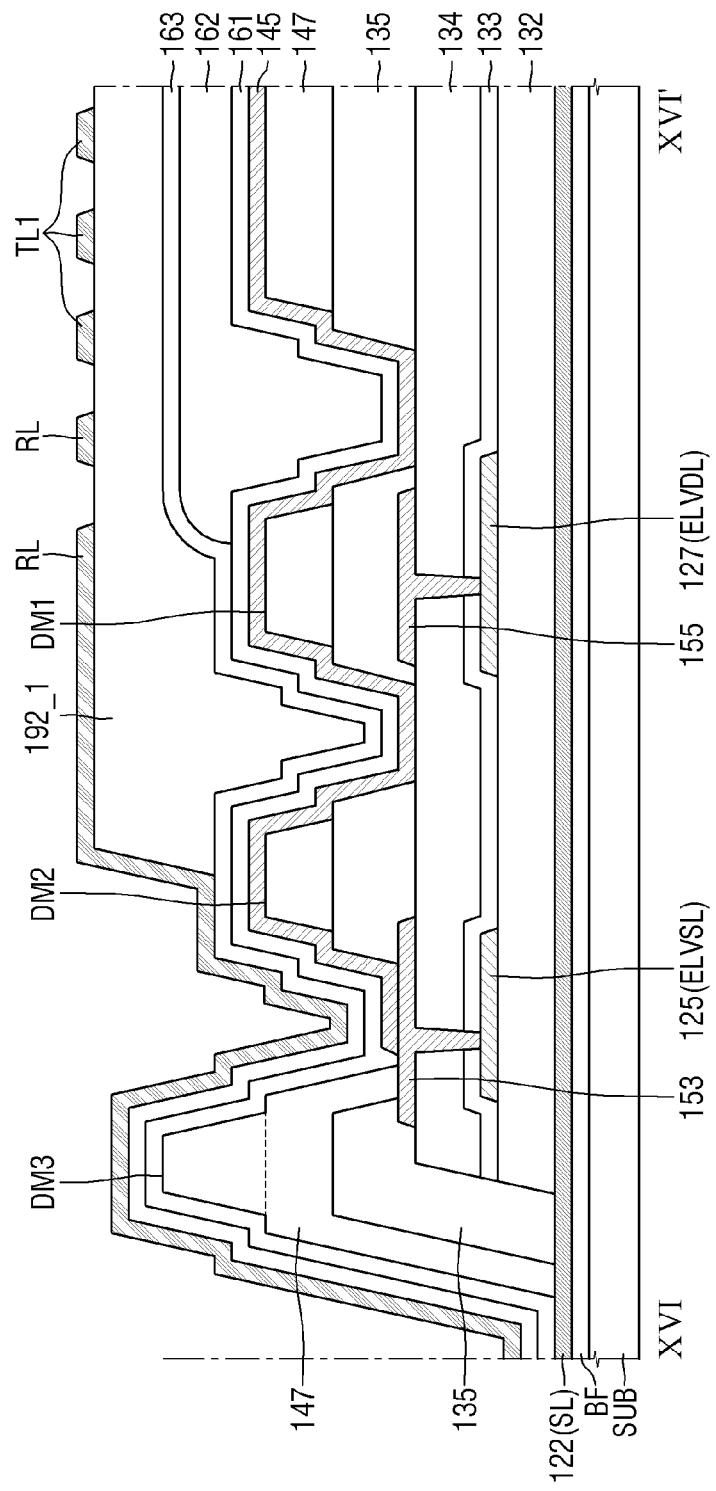
FIG. 18 is a cross-sectional view of another example which is taken along line XVI-XVI' of FIG. 16.

FIG. 18 is a cross-sectional view of another example which is taken along line XVI-XVI' of FIG. 16. The exemplary embodiment of FIG. 18 is different from the exemplary embodiment of FIG. 17 in that an outer planarizing layer disposed in the third non-display area is disposed above the middle dam DM2 and the inner dam DM1 and extends to the organic film 162 to be disposed even on the organic film 162.

Referring to FIG. 18, the outer planarizing layer 192_1 disposed in the third non-display area NDA is disposed on an entire surface of the second inorganic film 163 such that a portion of the second inorganic film 163 disposed on an upper surface of the middle dam DM2 and an entire upper surface of the outermost dam DM3 are exposed in the thickness direction of the display device 10.

Specifically, the outer planarizing layer 192_1 disposed in the third non-display area NDA may be disposed above an entire surface of the inner dam DM1 and may be disposed above the middle dam DM2 such that at least a portion of the middle dam DM2 is exposed. The outer planarizing layer 192_1 disposed in the first non-display area NDA may be disposed on the organic film 162. The outer planarizing layer 192_1 may be disposed on the entire surface of the second inorganic film 163 disposed on an upper surface of the organic film 162 so as to overlap the organic film 162 in a thickness direction thereof. Therefore, in the present exemplary embodiment, the sensing lines TL1 and RL may be disposed on an upper surface of the outer planarizing layer 192_1.

Figure 19:
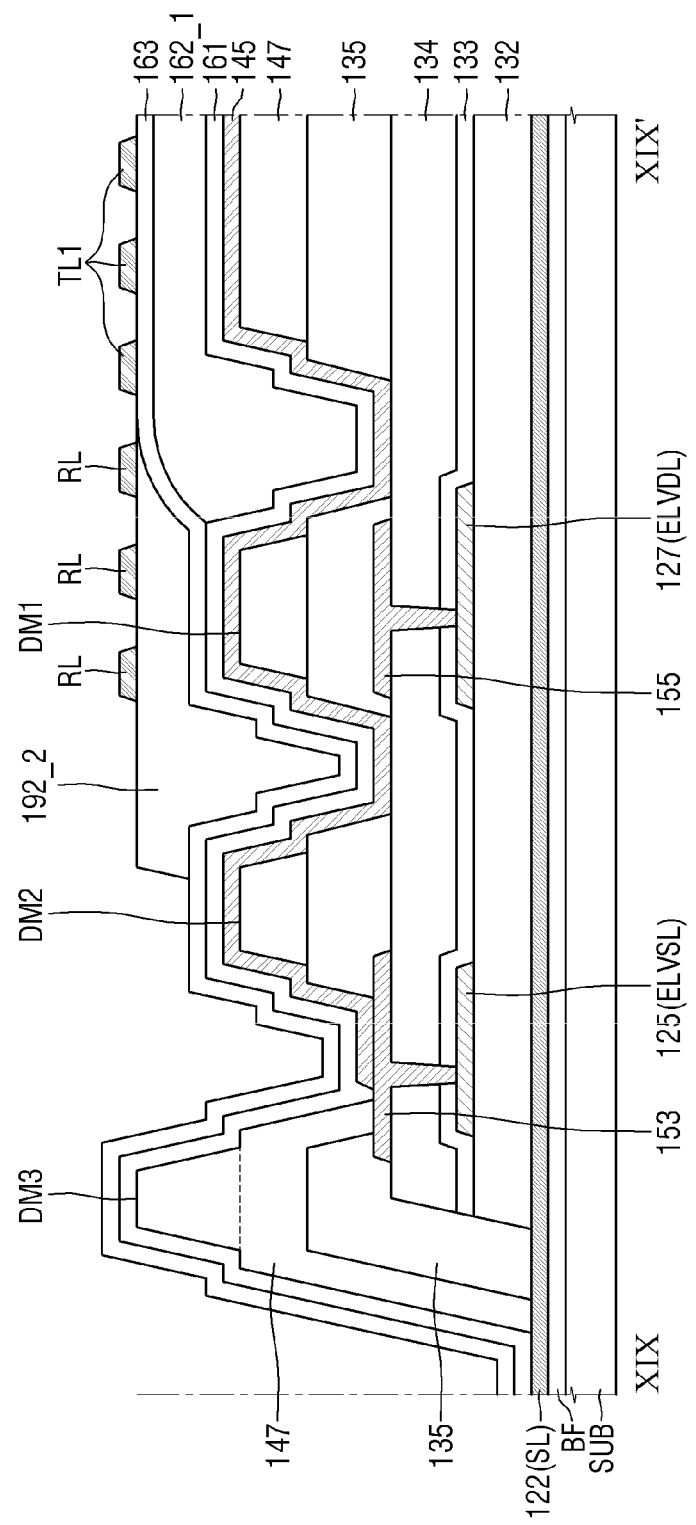
FIG. 19 is a cross-sectional view of an example which is taken along line XIX-XIX' of FIG. 16

FIG. 19 is a cross-sectional view of an example which is taken along line XIX-XIX' of FIG. 16. The exemplary embodiment of FIG. 19 is different from the exemplary embodiment of FIG. 17 in that an organic film disposed in the third non-display area is disposed to not overlap the plurality of dams DM1, DM2, and DM3 disposed in the third non-display area.

Specifically, the organic film 162_1 disposed in the third non-display area may not overlap the inner dam DM1, the middle DM2, and the outermost dam DM3. An end portion of the organic film 162_1 disposed in the third non-display area NDA may be disposed only on at least a portion of a side surface of the inner dam DM1. An outer planarizing layer 192_2 in the third non-display area NDA may be disposed to cover an entire upper surface of the inner dam DM1. An upper surface of the outer planarizing layer 192_2 in the third non-display area NDA may be aligned with an upper surface of the second inorganic film 163 disposed on the organic film 162_1.

Figure 20:
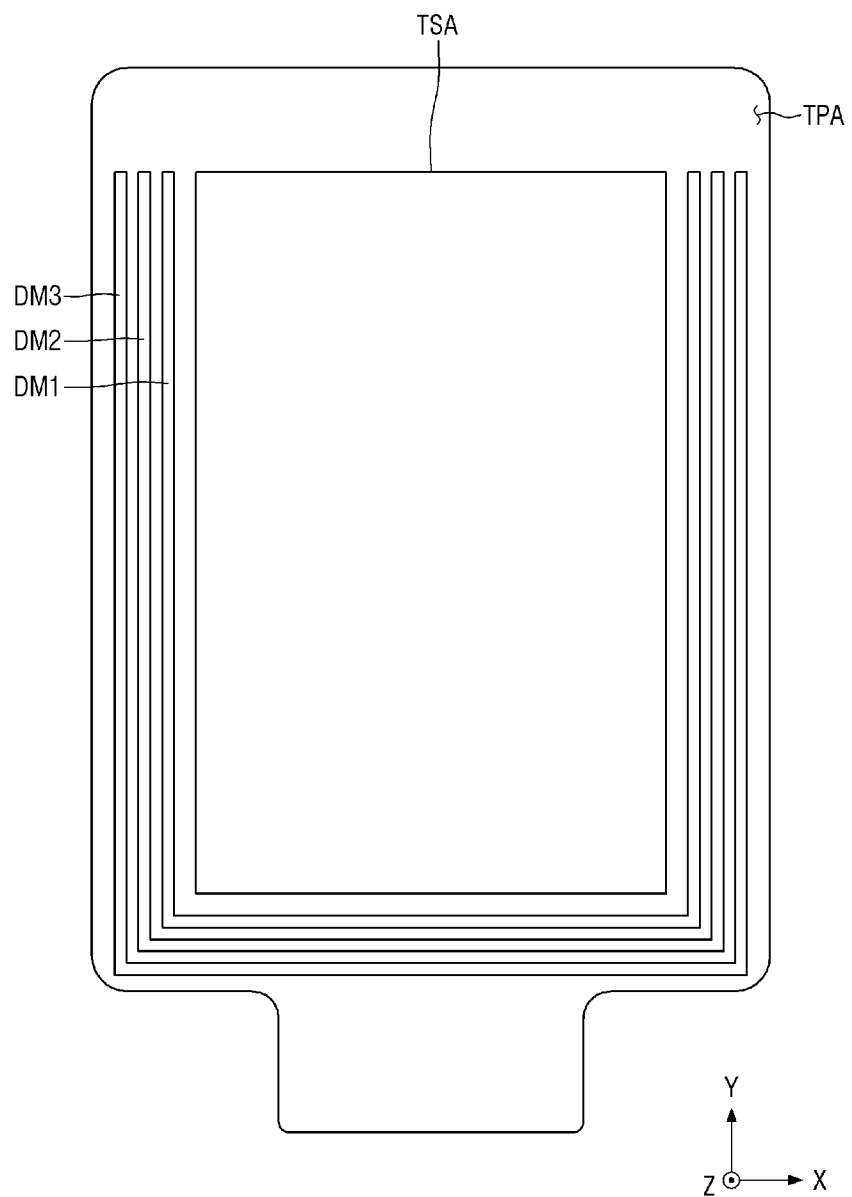
FIG. 20 is a plan view illustrating another example of a dam arrangement of a display device.
Figure 21:
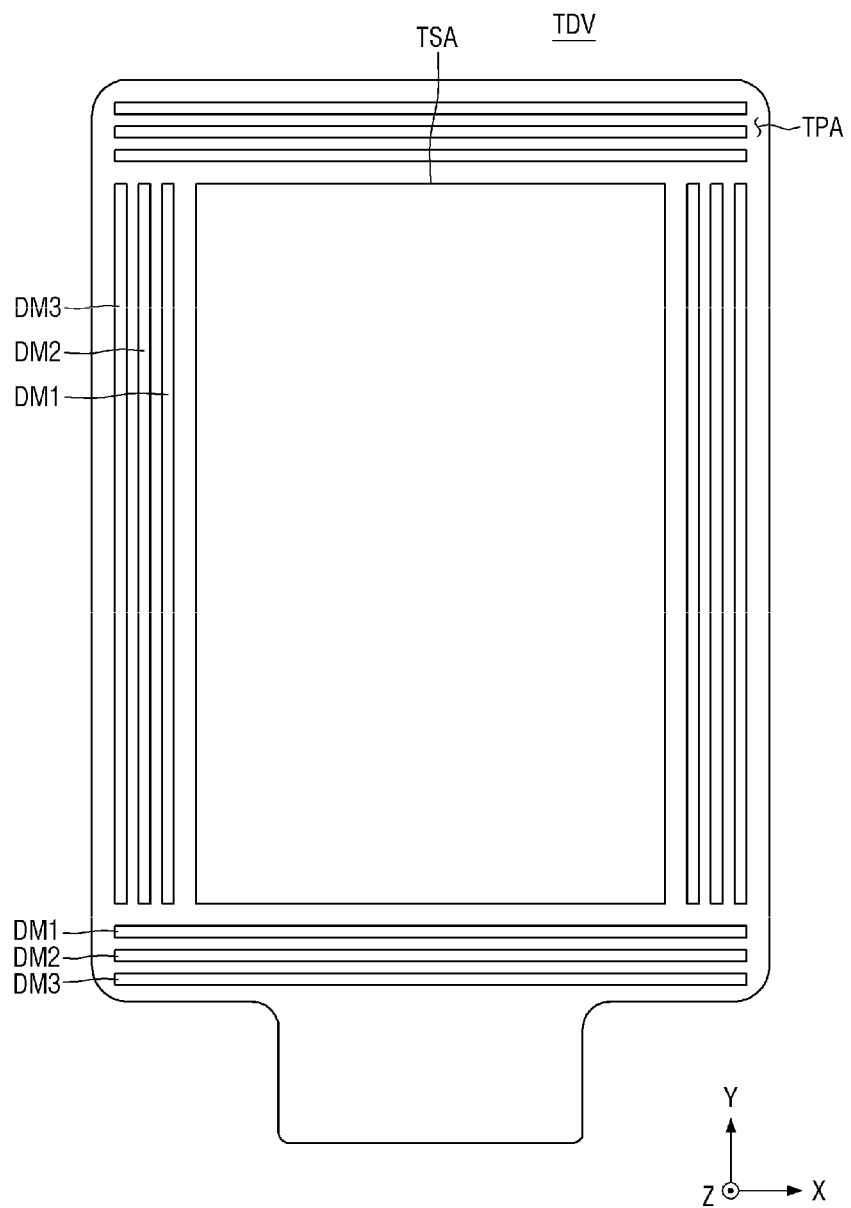
FIG. 21 is a plan view illustrating still another example of a dam arrangement of a display device.
Figure 22:
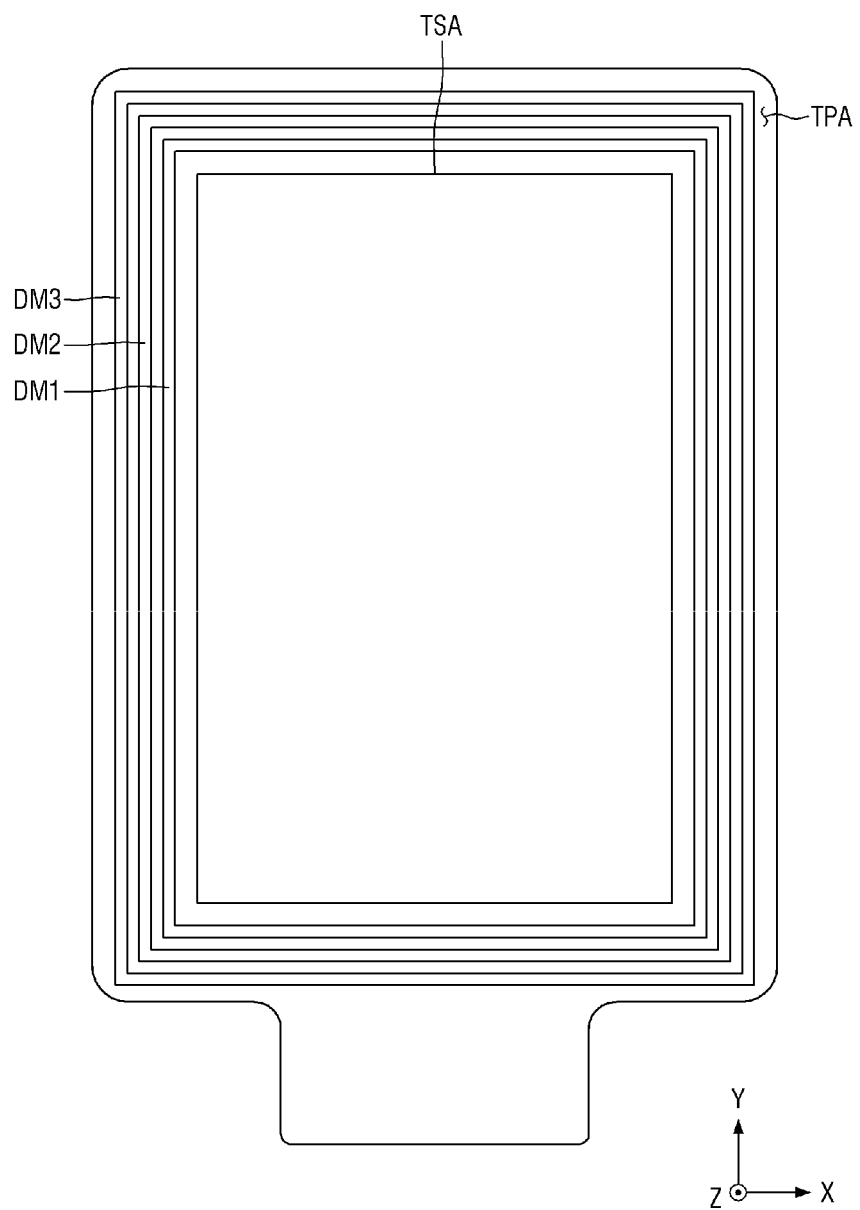
FIG. 22 is a plan view illustrating yet another example of a dam arrangement of a display device.

FIG. 20 is a plan view illustrating another example of a dam arrangement of a display device. FIG. 21 is a plan view illustrating still another example of a dam arrangement of a display device. FIG. 22 is a plan view illustrating yet another example of a dam arrangement of a display device.

Hereinafter, other exemplary embodiments of the present disclosure will be described. In the following exemplary embodiments, the same components as the above-described components will be denoted by the same reference numerals, and repetitive descriptions thereof will be omitted or simplified.

The exemplary embodiment of FIG. 20 is different from the exemplary embodiment of FIG. 9 in that dams DM1, DM2, and DM3 disposed in a non-display area NDA, a second non-display area NDA, and a third non-display area NDA are integrally formed.

Specifically, inner dams DM1 disposed in the first non-display area NDA, the second non-display area NDA, and the third non-display area NDA may be integrally formed. In addition, middle dams DM2 disposed in the first non-display area NDA, the second non-display area NDA, and the third non-display area NDA may be integrally formed. Outermost dams DM3 disposed in the first non-display area NDA, the second non-display area NDA, and the third non-display area NDA may be integrally formed.

The exemplary embodiment of FIG. 21 is different from the exemplary embodiment of FIG. 9 in that a plurality of dams DM1, DM2, and DM3 are further disposed at an upper side of a display panel 100 in a non-display area NDA.

Specifically, the plurality of dams DM1, DM2, and DM3 may be disposed at the upper side of the display panel 100 in the non-display area NDA. In the non-display area NDA, the plurality of dams DM1, DM2, and DM3 disposed at the upper side of the display panel 100 may have shapes which extend in one direction in a plan view. Specifically, the plurality of dams DM1, DM2, and DM3 disposed in a fourth non-display area NDA disposed adjacent to a second short side (upper side in FIG. 9) of the display panel 100 may have shapes which extend in a first direction (X-axis direction). The plurality of dams DM1, DM2, and DM3 disposed in the fourth non-display area NDA may be disposed to be spaced apart from each other in a second direction (Y-axis direction).

The exemplary embodiment of FIG. 22 is different from the exemplary embodiment of FIG. 21 in that dams DM1, DM2, and DM3 disposed in a first non-display area NDA, a second non-display area NDA, a third non-display area NDA, and a fourth non-display area NDA are integrally formed.

Specifically, inner dams DM1 disposed in the first non-display area NDA, the second non-display area NDA, the third non-display area NDA, and the fourth non-display area NDA may be integrally formed. In addition, middle dams DM2 disposed in the first non-display area NDA, the second non-display area NDA, the third non-display area NDA, and the fourth non-display area NDA may be integrally formed. Outermost dams DM3 disposed in the first non-display area NDA, the second non-display area NDA, the third non-display area NDA, and the fourth non-display area NDA may be integrally formed.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device including a display area and a non-display area having a pad area, the display device comprising:
    a substrate;
    a plurality of dams disposed on the substrate in the non-display area;
    an organic film which is disposed on the substrate in the display area and the non-display area and does not overlap at least some of the plurality of dams;
    an outer planarizing layer which is disposed outside the organic film and overlaps some of the plurality of dams; and
    a sensing line layer disposed on the organic film and the outer planarizing layer,
    wherein the plurality of dams include an inner dam, a middle dam, and an outermost dam,
    the non-display area includes a first non-display area disposed between the pad area and the display area, and
    the outer planarizing layer disposed in the first non-display area does not overlap and is spaced apart from the outermost dam disposed in the first non-display area.

2. The display device of claim 1, wherein the sensing line layer includes a plurality of sensing lines.

3. The display device of claim 2, wherein the sensing lines are spaced apart from each other on the organic film and the outer planarizing layer.

4. The display device of claim 2, wherein the outer planarizing layer overlaps the organic film.

5. The display device of claim 4, wherein the sensing lines are spaced apart from each other on the outer planarizing layer.

6. The display device of claim 1, wherein a height of the outermost dam is greater than a height of the inner dam and the middle dam.

7. The display device of claim 6, wherein a stepped portion is formed due to the outermost dam.

8. The display device of claim 1, wherein the inner dam and the middle dam have the same thickness.

9. The display device of claim 1, wherein the inner dam has a first thickness, the middle dam has a second thickness, and the outermost dam has a third thickness, in which the first thickness is greater than the second thickness, and the third thickness is greater than the second thickness,
    the inner dam has a first height, the middle dam has a second height, and the outermost dam has a third height, in which the first height is equal to the second height, and the third height is greater than the second height.

10. The display device of claim 1, wherein the non-display area further includes a second non-display area excluding the first non-display area and the pad area, and
    the outer planarizing layer disposed in the second non-display area overlaps the inner dam and the middle dam.

11. The display device of claim 10, wherein the outer planarizing layer overlaps at least a portion of the outermost dam.

12. The display device of claim 10, wherein the inner dam disposed in the first non-display area and the inner dam disposed in the second non-display area are integrally formed.

13. A display device including a display area and a non-display area disposed around the display area, the display device comprising:
    a substrate;
    a planarizing film disposed on the substrate in the display area and the non-display area;
    a pixel definition film disposed on the planarizing film in the non-display area and the display area, and exposing a portion of the planarizing film in display area;
    a light-emitting layer disposed on the planarizing film in the display area;
    a first inorganic film disposed on the light-emitting layer;
    an organic film disposed on the first inorganic film;
    a second inorganic film disposed on the organic film;
    a sensing line layer disposed on the second inorganic film;
    an outer planarizing layer interposed between the second inorganic film and the sensing line layer disposed in the non-display area; and
    a plurality of dams formed in the non-display area, wherein the plurality of dams include the pixel definition film and the planarizing film,
    the plurality of dams include an inner dam, a middle dam, and an outermost dam spaced apart from each other, and
    the outer planarizing layer is disposed to overlap the inner dam and at least a portion of the middle dam,
    the non-display area includes a pad area and a first non-display area disposed between the pad area and the display area, and
    the outer planarizinq layer disposed in the first non-display area does not overlap and is spaced apart from the outermost dam in the first non-display area.

14. The display device of claim 13, wherein the outer planarizing layer is disposed on the second inorganic film disposed on the organic film.

15. The display device of claim 13, wherein the sensing line layer includes a plurality of sensing lines, and
    at least one of the sensing lines overlaps the inner dam in a thickness direction thereof.

16. The display device of claim 13, wherein the inner dam has a first thickness, the middle dam has a second thickness, and the outermost dam has a third thickness, in which the first thickness is greater than the second thickness, and the second thickness is greater than the third thickness,
    the inner dam has a first height, the middle dam has a second height, and the outermost dam has a third height, in which the first height is equal to the second height, and the third height is greater than the second height.

17. The display device of claim 13, wherein the non-display area includes a second non-display area excluding the pad area and the first non-display area, and
- the outer planarizing layer disposed in the second non-display area is disposed above the inner dam and the middle dam.

18. The display device of claim 17, wherein the outer planarizing layer disposed in the second non-display area overlaps at least a portion of the outermost dam.

19. The display device of claim 18, wherein the sensing line layer disposed in the second non-display area includes a plurality of sensing lines, and
- some of the plurality of sensing lines disposed in the second non-display area are disposed to overlap at least one of the middle dam and the inner dam.

20. The display device of claim 18, wherein none of the sensing lines overlap the outermost dam.

\* \* \* \* \*